United States Patent [19]

Tosaka

[11] Patent Number: 5,462,844
[45] Date of Patent: Oct. 31, 1995

[54] LIGHT-SENSITIVE SILVER HALIDE COLOR PHOTOGRAPHIC MATERIAL AND PROCESS FOR PREPARING COLOR PROOF

[75] Inventor: Yasuo Tosaka, Odawara, Japan

[73] Assignee: Konica Corporation, Tokyo, Japan

[21] Appl. No.: 412,618

[22] Filed: Mar. 29, 1995

Related U.S. Application Data

[63] Continuation of Ser. No. 120,728, Sep. 13, 1993, abandoned.

[30] Foreign Application Priority Data

Sep. 16, 1992 [JP] Japan .................................. 4-246869

[51] Int. Cl.$^6$ ..................................................... G03C 1/46
[52] U.S. Cl. ........................ 430/503; 430/558; 430/557; 430/549; 430/358; 430/538
[58] Field of Search .................... 430/503, 558, 430/557, 358, 538, 549, 531, 533

[56] References Cited

U.S. PATENT DOCUMENTS

| | | | |
|---|---|---|---|
| 4,705,745 | 11/1987 | Kitchin et al. | 430/358 |
| 4,830,954 | 5/1989 | Matejec | 430/503 |
| 5,153,107 | 10/1992 | Deguchi | 430/358 |
| 5,262,290 | 11/1993 | Nakatsugawa et al. | 430/538 |

FOREIGN PATENT DOCUMENTS

| | | |
|---|---|---|
| 0305599 | 3/1989 | European Pat. Off. . |
| 0459331 | 12/1991 | European Pat. Off. . |
| 2139542 | 3/1979 | Japan . |
| 3122637 | 7/1982 | Japan . |
| 2172118 | 9/1986 | United Kingdom . |

*Primary Examiner*—Charles L. Bowers, Jr.
*Assistant Examiner*—Geraldine Letscher
*Attorney, Agent, or Firm*—Frishauf, Holtz, Goodman, Langer & Chick

[57] ABSTRACT

A light-sensitive silver halide color photographic material suited for preparing a color proofing image is provided, comprising a support and provided thereon a yellow image forming silver halide emulsion layer, a magenta image forming silver halide emulsion layer and a cyan image forming silver halide emulsion layer, wherein a silver halide emulsion with a spectral sensitivity having a part common to the respective spectral sensitivity regions pertaining to said yellow, magenta and cyan image forming silver halide emulsion layers is contained in at least one of the image forming silver halide emulsion layers; and the magenta image forming silver halide emulsion layer contains a compound represented by the following formula and a yellow dye forming coupler.

14 Claims, No Drawings

LIGHT-SENSITIVE SILVER HALIDE COLOR PHOTOGRAPHIC MATERIAL AND PROCESS FOR PREPARING COLOR PROOF

This is a Continuation of application Ser. No. 08/120,728, filed Sep. 13, 1993, now abandoned.

FIELD OF THE INVENTION

This invention relates to a light-sensitive silver halide color photographic material suited for the preparation of a proofing color image (a color proof) from plural sheets of black-and-white halftone dot images obtained by color separation and halftone dot image conversion, in color lithographic printing, and a process for preparing a color proof making use of the light-sensitive material.

BACKGROUND OF THE INVENTION

In the process of color lithographic printing, as methods for obtaining a color proof from plural sheets of black-and-white halftone dot images obtained by color separation and halftone dot image conversion, the overlay method and the surprint method are conventionally known, which are methods of forming color images by the use of a photopolymer or a diazo compound.

The overlay method is advantageous in that it is very simple, can enjoy a low production cost and can be used to carry out proofing only by overlaying four-color (subtractive primaries and black) film sheets. It, however, is disadvantageous in that the overlaying of the film sheets causes a gloss, which gives a texture different from that of a print.

The surprint method is a method in which colored images are superposed on the same support. This method is known to include methods in which the colored images are obtained by toner development that utilizes adhesive properties of a photopolymerizable material, as disclosed in U.S. Pat. Nos. 3,582,357 3,607,264 and 3,620,726.

Another method is known in which transfer is made on a support by the use of a light-sensitive coloring sheet followed by exposure and development to form an image, and thereafter another coloring sheet is superposed thereon, followed by repetition of the like process to prepare a color proof, as disclosed in Japanese Patent Examined Publication No. 27441/1972 and Japanese Patent Publication Open to Public Inspection (hereinafter referred to as Japanese Patent O.P.I. Publication) No. 501217/1981.

A still another method is known in which, using light-sensitive coloring sheets, corresponding color separation films are exposed and developed and the resulting respective colored images are transferred and formed on the same support, as disclosed in Japanese Patent O.P.I. Publication No. 97140/1984. As toners and as colorants for the coloring sheets, used to form these images, the same coloring materials as used in printing inks can be used. Because of this advantage, the resulting color proof can have a color tone resembling that of a print.

In these methods, however, images must be superposed and transferred in the process of preparing a color proof, and there are disadvantages that operation therefor takes a long time and they require a high production cost.

As methods that have eliminated such disadvantages, a method of preparing a color proof by the use of a silver salt color photographic material having a white support is disclosed in Japanese Patent O.P.I. Publication Nos. 113139/1981, No. 104335/1981, No. 280746/1987, No. 280747/1987, No. 280748/1987, No. 280749/1987, No. 280750/1987 and No. 280849/1987.

In this method, plural sheets of color-separated black-and-white halftone dot images, converted into halftone dot images color-separated from a color original, are successively photographically printed on a sheet of color photographic paper by contact printing or the like, followed by color development, and a color image formed of color dyes imagewise produced from couplers as a result of the color development is used as a proof image.

This technique, however, has a disadvantage that an attempt to make a color image resemble a print results in an insufficiency in the density of black images such as characters compared with that of the print and on the other hand any means taken to increase this density so as to make black image such as characters have a density resembling that of a print brings about a low resemblance of the print to the color image, making it difficult to satisfy the both at the same time.

As a technique to overcome this disadvantage, it is conventionally known to provide, in addition to a yellow color forming layer, a magenta color forming layer and a cyan color layer, a fourth black layer having a spectral sensitivity different form that of any other layer. Japanese Patent O.P.I. Publications No. 289846/1990 and No. 183251/1990 also disclose techniques that can solve this problem. All of them, however, still have the problems such that color tones may vary when photographic processing is ordinarily carried out and color tones of the resulting images may have an insufficient stability, and a further improvement is sought in order for the techniques to be put into practical use.

With regard to a reflective support comprising a base paper provided on each side thereof with a polyolefin resin coat layer, it is disclosed, for example, in Japanese Patent O.P.I. Publications No. 46035/1979 and No. 28640/1990 to increase the amount of titanium dioxide incorporated in the polyolefin resin coat layer on the side on which photographic emulsions are coated. There, however, is provided no black image forming layer, and nothing is mentioned about the problem of the variations of color tones that may occur when photographic processing is ordinarily carried out.

SUMMARY OF THE INVENTION

Accordingly, an object of the present invention is to provide a color proof light-sensitive material through which a color proof with an improved resemblance in image quality to a print can be obtained as an image with a stable color tone when a color proof is prepared using a light-sensitive silver halide color photographic material from halftone dot image information obtained by color separation and halftone dot image conversion, and to provide a process for preparing a color proof making use of the light-sensitive material.

The above object of the present invention can be achieved by the following constitution.

(1) A light-sensitive silver halide color photographic material comprising a support and provided thereon a yellow image forming silver halide emulsion layer, a magenta image forming silver halide emulsion layer and a cyan image forming silver halide emulsion layer, wherein a silver halide emulsion with a spectral sensitivity having a part common to the respective spectral sensitivity regions pertaining to said yellow, magenta and cyan image forming silver halide emulsion layers is mixed in at least one of said image forming silver halide emulsion layers, and said magenta image forming silver halide emulsion layer contains at least one compound represented by the following Formula M-I and at least one yellow coupler. Formula M-I

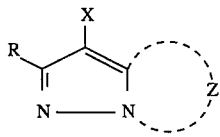

In the formula, Z represents a group of non-metal atoms necessary to complete a nitrogen-containing heterocyclic ring, and the ring formed by Z may have a substituent.

X represents a hydrogen atom or a group capable of being split off upon reaction with an oxidized product of a color developing agent. R represents a hydrogen atom or a substituent.

(2) The light-sensitive silver halide color photographic material according to paragraph (1), wherein the support is a reflective support comprising a base paper provided on each side thereof with a polyolefin resin coat layer, and the polyolefin resin coat layer formed on the reflective support on its side on which photographic emulsions are coated contains 13% or more of a white pigment.

(3) A process for preparing a color proof by subjecting a light-sensitive silver halide color photographic material comprising a support and provided thereon a yellow image forming layer, a magenta image forming layer and a cyan image forming layer, to exposure based on halftone dot image information comprised of color-separated yellow image information, magenta image information, cyan image information and black image information, wherein said light-sensitive silver halide color photographic material is the light-sensitive silver halide color photographic material as described in paragraph (1) or (2).

DETAILED DESCRIPTION OF THE INVENTION

The present invention will be described below in detail.

The reflective support according to the present invention will be described.

The reflective support according to the present invention is basically formed of a base paper and a polyolefin resin is coated on each side thereof. Such a support is preferably used.

The base paper of the present invention may be selected from materials commonly used in photographic papers. For example, they may include natural pulp, synthetic pulp, mixtures of natural pulp and synthetic pulp, and besides various types of combination paper materials. In general, natural pulp mainly composed of needle-leaved tree pulp, broad-leaved tree pulp, or a mixed pulp of needle-leaved tree pulp and broad-leaved tree pulp can be widely used.

In the support described above, additives such as a sizing agent, a fixing agent, a reinforcing agent, a filler, an antistatic agent and a dye may be mixed. The support may also be appropriate..y coated with a surface-sizing agent, a surface-strengthening agent, an antistatic agent and so forth on its surface.

The support used may have a smooth surface, usually having a basis weight of from 50 to 300 g/m$^2$. The polyolefin resin coated on its both sides may be selected from polyethylene, α-olefins, homopolymers as exemplified by polypropylene, copolymers of at least two kinds of the olefins, or mixtures of at least two kinds of these various polymers. Particularly preferred polyolefin resins are low-density polyolefin and high-density polyolefin, or mixtures of these.

There are no particular limitations on the molecular weight of the polyolefin resin. In usual instances, polyolefin resins with a molecular weight ranging from 20,000 to 200,000 are used.

The polyolefin resin coat layer formed on the reflective support according to the present invention on its side on which photographic emulsions are coated may preferably have a thickness of from 25 to 50 μm, and more preferably from 25 to 35 μm.

The polyolefin used for its coating on the back surface (the side opposite to the side on which emulsion layers are provided) of the support is usually comprised of a mixture of a low-density polyethylene and a high-density polyethylene, which mixture itself is melt-coated. The resulting layer is commonly often subjected to matting.

In the polyolefin resin used for its coating on the top surface (the side on which emulsion layers are provide) of the support, a white pigment is dispersedly mixed preferably in an amount of from 13 to 20% by weight, and more preferably from 15 to 20% by weight.

As the white pigment, inorganic and/or organic white pigments may be used, and inorganic white pigments are preferred. Such pigments may include alkaline earth metal sulfates such as barium sulfate, alkaline earth metal carbonates such as calcium carbonate, finely divided silicate, silicas of synthetic silicates, calcium silicate, alumina, alumina hydrates, titanium oxide, zinc oxide, talc and clay.

Of these, barium sulfate, calcium carbonate and titanium oxide are preferred, and barium sulfate an titanium oxide are more preferred.

The titanium oxide may be of either a rutile type or an anatase type. Titanium oxide whose particle surfaces have been coated with a metal oxide such as hydrated alumina and hydrated ferrite.

In addition, various additives such as a color pigment, a fluorescent brightener and an antioxidant may be added.

When the coat layers are formed on the top and back surfaces of the support, the resin layer on the top surface side may be made to have a little higher density than that on the back surface or the coating weight on the back surface may be made larger than that on the top surface. Such means are commonly taken in order to increase the flatness of photographically processed photographic papers in ordinary use environments.

The coat layers on both the top surface and the back surface of the support can be commonly formed by applying a polyolefin resin composition onto the support by melt extrusion coating. To carry out this melt extrusion coating, the polyolefin resin composition is usually melt-extruded on a running support from a slit die of an extruder so as to be coated in the form of a film of a single layer or plural layers. The melt extrusion may usually be carried out at a temperature of from 200° to 320° C. The top surface, or optionally the both top and back surfaces, of the support may be subjected to corona discharge treatment, flame treatment or the like. If necessary, a subcoat layer may also be provided on the surface of the top surface coat layer to improve its adhesion to a photographic emulsion layer or a back coat layer may be provided on the back surface coat layer to improve its print writability and antistatic properties.

In a preferred embodiment of the present invention, a protective layer may be formed on the outermost surface of the light-sensitive material, and also finely divided powder may be distributed in the protective layer.

The finely divided powder that may be incorporated into the protective layer is commonly often called a matting agent in the present industrial field. Accordingly, it is herein called a matting agent unless particularly noted.

The matting agent that maybe used in the present invention may include, for example, crystalline or noncrystalline silica, titanium dioxide, magnesium oxide, calcium carbonate, barium sulfate, strontium barium sulfate aluminum magnesium silicate, silver halides, silicon dioxide, an acrylic acid/ethyl acrylate copolymer, an acrylic acid/methyl methacrylate copolymer, an itaconic acid/styrene copolymer, a maleic acid/methyl methacrylate copolymer, a maleic acid/styrene copolymer, an acrylic acid/phenyl acrylate copolymer, polymethyl methacrylate, an acrylic acid/methacrylic acid/ethyl methacrylate copolymer, polystyrene, starch, and cellulose acetate propionate. Besides, it may include the compounds as disclosed in U.S. Pat. Nos. 1,221,980 and 2,992,101. Any of these may be used alone or in combination of two or more kinds. The matting agent may also be used in combination with colloidal silica.

The matting agent may have a particle size of from 1 to 10 μm, and preferably from 3 to 10 μm, in average particle diameter.

The average particle diameter herein referred to is an average value of diameters of particles in the case of spherical particles or, in the case of cubic particles or those other than spherical ones, diameters obtained when projected images of particles are calculated as circular images having the same areas, and is defined by the following expression.

$$\bar{r} = \Sigma n_i r_i / \Sigma n_i$$

wherein ri is the particle diameter of individual particles and ni is the number thereof.

As a specific measuring method, the method as disclosed in Japanese Patent O.P.I. Publication No. 29243/1984 can be used.

In the present invention, the matting agent is dispersedly incorporated in the protective layer, for example, the protective layer as the outermost layer of the light-sensitive material. As a method by which the matting agent is dispersedly incorporated, it may be dispersed in a hydrophilic binder optionally containing a nonionic, cationic or anionic surface active agent together with other additives optionally added, by emulsification dispersion utilizing a shear stress by means of a high-speed rotating mixer, a homogenizer, an ultrasonic dispersion machine, a ball mill or the like. The resulting dispersion may be coated by any desired method to form the protective layer.

The matting agent may preferably be incorporated in a coating weight of from 2.5 to 250 mg, and more preferably from 10 to 50 mg, per 1 m² of the protective layer. The matting agent may preferably be in a content of from 0.5 to 5% by weight, and more preferably from 1 to 3% by weight, based on the weight of the hydrophilic binder.

As the reflective support according to the present invention, it is also possible to use a polypropylene or the like synthetic resin film support coated with a polyolefin on its surface.

There are no particular limitations on the thickness of the reflective support according to the present invention. Those with a thickness of from 80 to 160 μm may preferably be used, and those with a thickness of from 90 to 130 μm are particularly preferred.

The surface of the reflective support according to the present invention may have a flat form or may have an appropriate surface roughness. It is preferable to select a reflective support that can have a gloss close to a print. For example, it is preferable to use a white support having a surface roughness SRa of from 0.30 to 3.0 μm, as prescribed in JIS B 0601-1976.

In the present invention, the surface on which an image is formed (image forming surface) may preferably be so made as to have a surface roughness of from 0.30 to 3.0 μm. For this purpose, the matting agent may be incorporated in a component layer on the side of the image forming surface of the light-sensitive material. The matting agent may be added to a layer including a silver halide emulsion layer, a protective layer, an intermediate layer, an undercoat layer and so forth, and may be added to plural layers. It may preferably be added to the uppermost layer of the light-sensitive material.

The surface of the light-sensitive silver halide color photographic material of the present invention on its side of the image forming layer may preferably have a gloss close to that of a print. For example, the surface of the surface forming layer after photographic processing may preferably have a glossiness Gs (60°) of from 5 to 15 as measured by the method prescribed in JIS-Z 8741. It may more preferably have a glossiness of from 5 to 20.

As silver halide emulsions used in the present invention, surface latent image forming silver halide emulsions capable of forming a latent image on the surface as a result of imagewise exposure may be used, which are capable of forming a negative image upon development. Internal latent image forming silver halide emulsions whose grain surfaces are not previously fogged may also be used, which are capable of obtaining a direct positive image by applying a fogging treatment (nucleating treatment) after imagewise exposure, followed by surface development, or, after imagewise exposure, carrying out surface development while applying a fogging treatment. The latter may also preferably be used.

The above fogging treatment may be carried out by applying overall exposure or by a chemical means using a fogging agent. It may also be carried out using a strong developing solution, and still also may be carried out by a heat treatment or the like. The emulsions containing internal latent image forming silver halide emulsion grains as described above refer to emulsions containing silver halide grains having a sensitivity speck mainly in the inside of a silver halide crystal grain and capable of forming a latent image in the inside of the grain as a result of exposure.

In the technical field of such internal latent image forming direct positives, various techniques are hitherto known. For example, methods as disclosed in U.S. Pat. Nos. 2,592,250, 2,466,957, 2,497,875, 2,588,982, 3,761,266, 3,761,276 and 3,796,577, British Patent No. 1,151,353, etc. are known in the art.

The mechanism by which positive images are formed is not necessarily clear. In Photographic Science and Engineering, Vol. 20, page 158 (1976), for example, it is explained as follows:

Photoelectrons produced in silver halide crystal grains as a result of imagewise exposure are selectively captured inside the grains to from an internal latent image. This internal latent image acts as a capture center effective for the electrons present in the conduction band, and hence it follows that, in the grains having been exposed, the electrons injected in the course of the subsequent fogging development are captured inside the grains to intensify the latent image. In this case, the latent image is present inside the grains and hence is not developed by surface development. On the other hand, in the grains having been not imagewise exposed, at least part of the electrons injected are captured on grain surfaces and a latent image is formed there, so that the grains can be developed by surface development.

The emulsions having internal latent image forming silver halide grains not previously fogged that can be used in the present invention are emulsions having silver halide grains that form a latent image mainly inside the silver halide grains and have the greater part of sensitivity specks in the insides of the grains, and may contain any desired silver halides as exemplified by silver bromide, silver chloride, silver chlorobromide, silver chloroiodide, silver iodobromide and silver chloroiodobromide.

Particularly preferable emulsions are, when part of an emulsion sample coated on a transparent support so as to give a coating silver weight within the range of from about 1 to 3.5 g/m² is exposed on a light intensity scale over a certain predetermined time of from about 0.1 second to about 1 second and then developed at 20° C. for 4 minutes using the following surface developing solution A capable of developing only the surface image on grains containing substantially no silver halide solvent, those showing a maximum density not greater than 1/5 of a maximum density obtained when another part of the same emulsion sample is exposed and then developed at 20° C. for 4 minutes using the following internal developing solution B capable of developing the image inside the grains. More preferable emulsions are those in which the maximum density obtained using the surface developing solution A is not greater than 1/10 of the maximum density obtained using the internal developing solution B.

| (Surface developing solution) | |
| --- | --- |
| Methol | 2.5 g |
| L-ascorbic acid | 10.0 g |
| Sodium metaborate (tetrahydrate) | 35.0 g |
| Potassium bromide | 1.0 g |
| By adding water, made up to | 1,000 cc |
| (Internal developing solution) | |
| Methol | 2.0 g |
| Sodium sulfite (anhydrous) | 90.0 g |
| Hydroquinone | 8.0 g |
| Sodium carbonate (monohydrate) | 52.5 g |
| Potassium bromide | 5.0 g |
| Potassium iodide | 0.5 g |
| By adding water, made up to | 1,000 cc |

The internal latent image forming silver halide emulsions preferably used in the present invention may include those prepared by various methods. For example, they are the conversion type silver halide emulsions as disclosed in U.S. Pat. No. 2,592,250, the silver halide emulsions having silver halide grains internally chemically sensitized as disclosed in U.S. Pat. Nos. 3,206,316, 3,317,322 and 3,367,778, the emulsions having silver halide grains internally containing polyvalent metal ions as disclosed in U.S. Pat. Nos. 3,271,157 and 3,447,927, the silver halide emulsions having silver halide grains containing a doping agent and whose grain surfaces have been weakly chemically sensitized as disclosed in U.S. Pat. No. 3,761,276, or the silver halide emulsions comprising grains having a multilayered structure as disclosed in Japanese Patent O.P.I. Publications No. 8524/1975, No. 38525/1975 and No. 2408/1978, and besides the silver halide emulsions as disclosed in Japanese Patent O.P.I. Publications No. 156614/1977 and No. 127549/1980.

The internal latent image forming silver halide grains preferably used in the present invention may be formed of a silver halide with any desired halogen composition, as exemplified by silver bromide, silver chloride, silver chlorobromide, silver chloroiodide, silver iodobromide or silver chloroiodobromide. Grains containing silver chloride have excellent development processability, and are suitable for rapid processing.

The silver halide grains used in the present invention may be of any form including a cube, an octahedron, a tetradecahedron comprised of a mixture of (100) plane and (111) plane, a form having (110) plane, a spherical form and a tabular form. Grains having an average grain size of from 0.05 to 3 μm may preferably be used. With regard to grain size distribution, the silver halide emulsions may be either monodisperse emulsions, having a uniform grains size and crystal habit, or emulsions having no uniform grains size and crystal habit. Monodisperse silver halide emulsions are preferred as having a uniform grain size and crystal habit.

In the present invention, the monodisperse silver halide emulsions refer to emulsions in which the weight of silver halide included in the grain size range of ±20% around average grain size rm is not less than 60%, preferably not less than 70%, and more preferably not less than 80%, of the weight of the whole silver halide grains.

Herein the average grain size rm is defined to be grain size $r_i$ determined when $n_i \times r_i^3$ which is the product of frequency $n_i$ of grains having grain size $r_i$ and $r_i^3$ comes to be maximum. (Effective numeral is 3 figures, and minimum numeral is rounded off.) The grain size herein referred to is, in the case of spherical silver halide grains, a diameter thereof, or, in the case of grains other than the spherical grains, a diameter obtained when a projected image of a grain is calculated as a circular image having the same area. The grain size can be obtained, for example, by photographing the grains at magnifications of 10,000 to 50,000 using an electron microscope and actually measuring the diameters or areas of the grains on a print. (The number of grains measured may be 1,000 or more selected at random.)

Monodisperse emulsions having a particularly preferred monodispersity have a breadth of distribution (or coefficient of variation) calculated by the following expression, of 20% or less.

(grain size standard deviation)/(average grain size)× 100=breadth of distribution (%).

Here the average grain size and grain size standard deviation are those determined from ri in the above definition.

The monodisperse emulsions can be obtained by adding in a gelatin solution containing seed grains, a water-soluble silver salt solution and a water-soluble halide solution by double jet precipitation while controlling their pAg and pH. The rate of addition may be determined by making reference to Japanese Patent O.P.I. Publications No. 48521/1979 and No. 49938/1983. As a method by which monodisperse emulsions with a higher monodispersity are obtained, it is possible to apply the method of growth carried out in the presence of a tetrazaindene compound, as disclosed in Japanese Patent O.P.I. Publication No. 12293/1985.

In the light-sensitive silver halide color photographic material of the present invention, the yellow image forming silver halide emulsion layer, magenta image forming silver halide emulsion layer and cyan image forming silver halide emulsion layer contain silver halide emulsions having spectral sensitivity wavelength regions respectively different from one another, and also at least one of the above yellow, magenta and cyan image forming silver halide emulsion layers contains a silver halide emulsion with a spectral sensitivity having a part common to all the silver halide emulsions having spectral sensitivity wavelength regions respectively different from one another, contained in the yellow, magenta and cyan image forming silver halide emulsion layers.

In the present invention, the yellow image forming layer, magenta image forming layer and cyan image forming layer have spectral sensitivities different from one another. This means that, in any wavelengths in spectral sensitivity wavelength regions of the respective layers, there may be a wavelength that shows a sensitivity at least 4 times the spectral sensitivity of other layers, and there may preferably be a wavelength that shows a sensitivity at least 8 times the same.

The above silver halide emulsion with a spectral sensitivity having a part common to all the silver halide emulsions having spectral sensitivity wavelength regions respectively different from one another, contained in at least one of the yellow, magenta and cyan image forming silver halide emulsion layers in the present invention will be described. In the present specification, among the silver halide emulsions having spectral sensitivity wavelength regions respectively different from one another, the silver halide emulsion contained in the yellow image forming layer is called "Y-emulsion", the silver halide emulsion contained in the magenta image forming layer "M-emulsion" and the silver halide emulsion contained in the cyan image forming layer "C-emulsion" so that the description can be simplified. The silver halide emulsion with a spectral sensitivity having a part common to all the silver halide emulsions having spectral sensitivity wavelength regions respectively different from one another, contained in at least one of the yellow, magenta and cyan image forming silver halide emulsion layers is also called "P-emulsion". In the present invention, the P-emulsion has a spectral sensitivity having a part common to the spectral sensitivity wavelength region of the Y-emulsion, and also has a spectral sensitivity having a part common to the spectral sensitivity wavelength region of the M-emulsion and a spectral sensitivity having a part common to the spectral sensitivity wavelength region of the C-emulsion.

The ratio of the sensitivity of the Y-emulsion to that of the P-emulsion, obtained when exposed to light having any wavelength within the spectral sensitivity region of the Y-emulsion, may preferably be in the range of from 1/10 to 10. Similarly, the ratio of the sensitivity of the M-emulsion to that of the P-emulsion, obtained when exposed to light having any wavelength within the spectral sensitivity region of the M-emulsion, may preferably be in the range of from 1/10 to 10. Similarly, the ratio of the sensitivity of the C-emulsion to that of the P-emulsion, obtained when exposed to light having any wavelength within the spectral sensitivity region of the C-emulsion, may preferably be in the range of from 1/10 to 10.

In a preferred embodiment of the present invention, the yellow image forming layer contains a blue-sensitive silver halide emulsion, the magenta image forming layer contains a green-sensitive silver halide emulsion and the cyan image forming layer contains a red-sensitive silver halide emulsion. The yellow image forming emulsion layer further contains a silver halide emulsion having a sensitivity to all of blue light, green light and red light. The magenta image forming emulsion layer and the cyan image forming emulsion layer each similarly contain a silver halide emulsion having a sensitivity to all of blue light, green light and red light.

In another preferred embodiment, the yellow image forming layer contains a blue-sensitive silver halide emulsion, the magenta image forming layer contains a red-sensitive silver halide emulsion and the cyan image forming layer contains a red-sensitive silver halide emulsion. The yellow image forming emulsion layer further contains a silver halide emulsion having a sensitivity to all of green light, red light and infrared light. The magenta image forming emulsion layer and the cyan image forming emulsion layer each similarly contain a silver halide emulsion having a sensitivity to all of green light, red light and infrared light.

In still another preferred embodiment, the yellow image forming layer contains a blue-sensitive silver halide emulsion, the magenta image forming layer contains a green-sensitive silver halide emulsion and the cyan image forming layer contains a red-sensitive silver halide emulsion. The yellow image forming layer and the cyan image forming layer each further contain a silver halide emulsion having a sensitivity to all of blue light, green light and red light.

Besides the combinations as described above, the color sensitivities of the Y-emulsion, M-emulsion and C-emulsion can be arbitrarily selected, and any combination may be selected so long as the color sensitivities are different from one another. It is enough for the P-emulsion to be contained in at least one of the yellow layer, the magenta layer and the cyan layer.

The silver halide emulsion (P-emulsion) with a spectral sensitivity having a part common to the respective spectral sensitivity regions pertaining to the yellow, magenta and cyan image forming silver halide emulsion layers can be accomplished by selecting spectral sensitizers. For example, an emulsion having sensitivities to all the blue light, green light and red light can be prepared by using a blue-sensitive spectral sensitizer, a green-sensitive spectral sensitizer and a red-sensitive spectral sensitizer in combination.

Grain size of the grains in the respective emulsion layers of the light-sensitive silver halide photographic material according to the present invention can be determined in a wide range, taking account of performances required therefor, in particular, various properties such as sensitivities, sensitivity balances, color separation performance, sharpness and graininess.

In a preferred embodiment of the present invention, the silver halide may have a grain size of from 0.1 μm to 0.6 μm for the red-sensitive layer emulsion, from 0.15 μm to 0.8 μm for the green-sensitive layer emulsion, and from 0.3 μm to 1.2 μm for the blue-sensitive layer emulsion.

There are no particular limitations on the grain size of the above P-emulsion according to the present invention. It may preferably have an average grain size in a ratio of 0.4 to 3.0 with respect to a maximum average grain size among those of the Y-emulsion, M-emulsion and C-emulsion. Its average grain size may more preferably be in a ratio of 0.4 to 3.0.

The magenta coupler in the present invention particularly preferably includes a magenta coupler of the following Formula M-I.

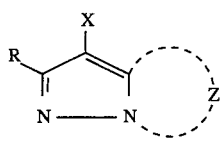

In the formula, Z represents a group of non-metal atoms necessary to complete a nitrogen-containing heterocyclic ring. The ring formed by said Z may have a substitutent.

X represents a hydrogen atom or a group capable of being split off upon reaction with an oxidized product of a color developing agent. R represents a hydrogen atom or a substituent.

In the above Formula M-I, there are no particular limitations on the substituent represented by R. It may typically include groups such as alkyl, aryl, anilino, acylamino, sulfonamide, alkylthio, arylthio, alkenyl and cycloalkyl. Besides these, it may also include a halogen atom, groups such as cycloalkenyl, alkynyl, a heterocyclic ring, sulfonyl, sulfinyl, phosphonyl, acyl, carbamoyl, sulfamoyl, cyano, alkoxy, aryloxy, heterocyclic oxy, siloxy, acyloxy, carbamoyloxy, amino, alkylamino, imido, ureido, sulfamoylamino, alkoxycarbonylamino, aryloxycarbonylamino, alkoxycarbonyl, aryloxycarbonyl and heterocyclic thio, a spiro compound residual group, and a bridged hydrocarbon compound residual group.

Preferable scopes and examples of the substituent represented by R, the group represented by X, capable of being split off upon reaction with an oxidized product of a color developing agent, the nitrogen-containing heterocyclic ring formed by Z and the substituent the ring formed by Z may have are the same as those disclosed in European Patent Publication No. 0327272, page 5, line 23 to page 8, line 52.

Typical examples of the magenta coupler represented by Formula M-I are shown below.

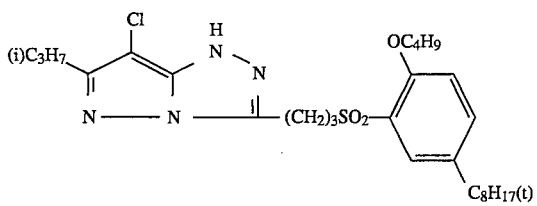

M-1

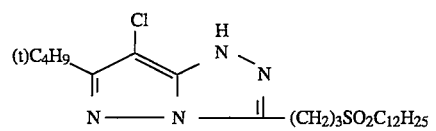

M-2

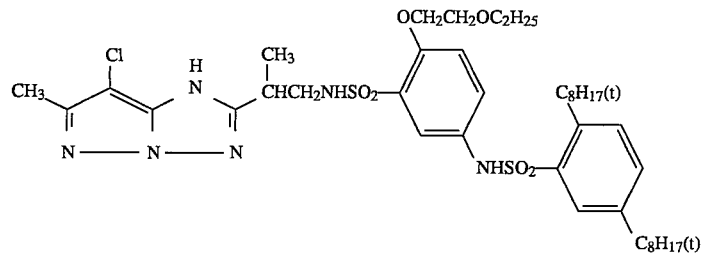

M-3

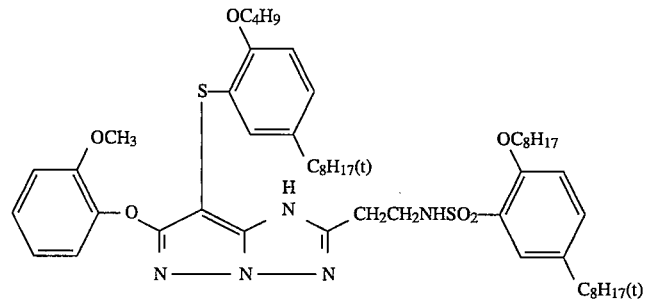

M-4

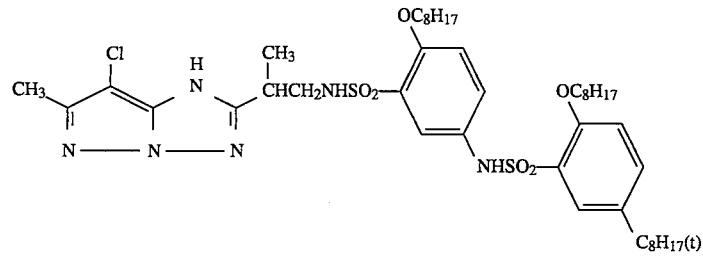

M-5

-continued
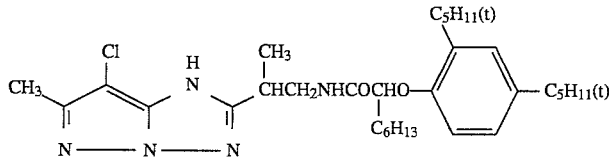
M-6
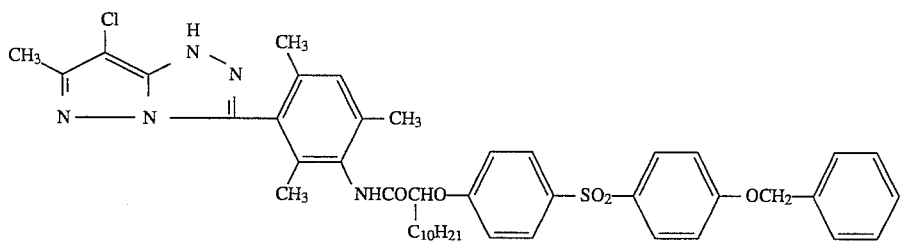
M-7
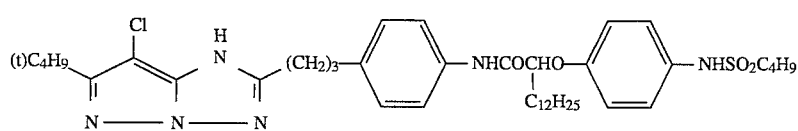
M-8
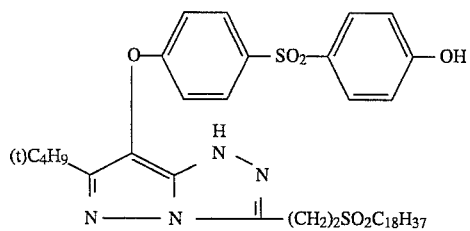
M-9
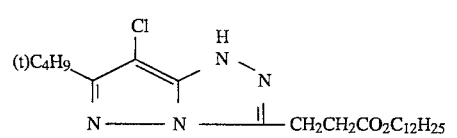
M-10
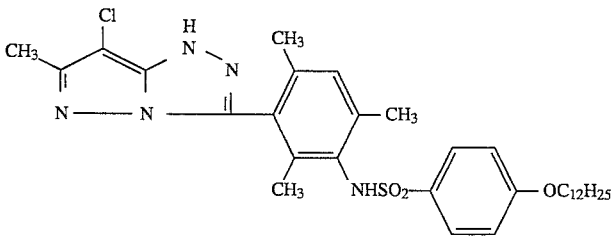
M-11
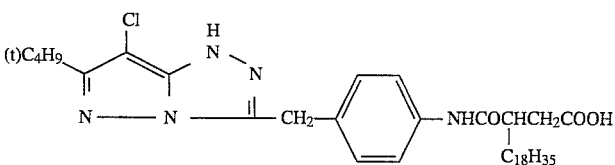
M-12
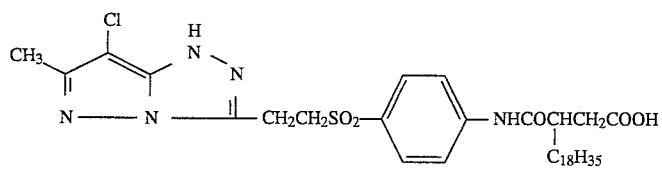
M-13
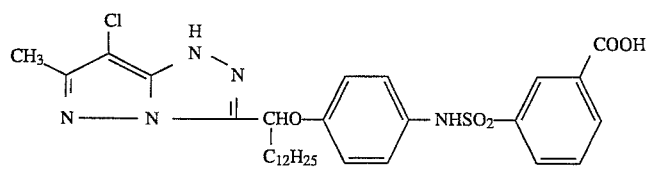
M-14

-continued

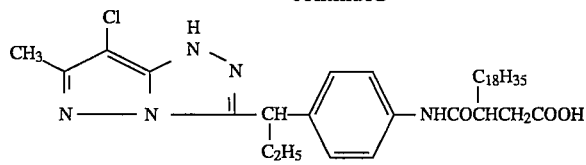
M-15

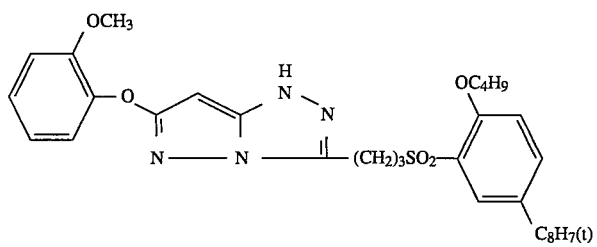
M-16

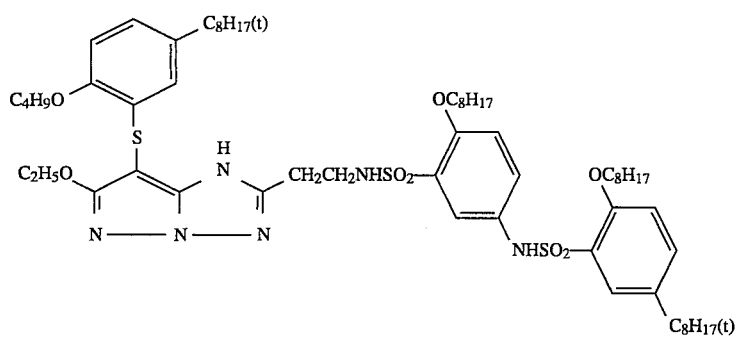
M-17

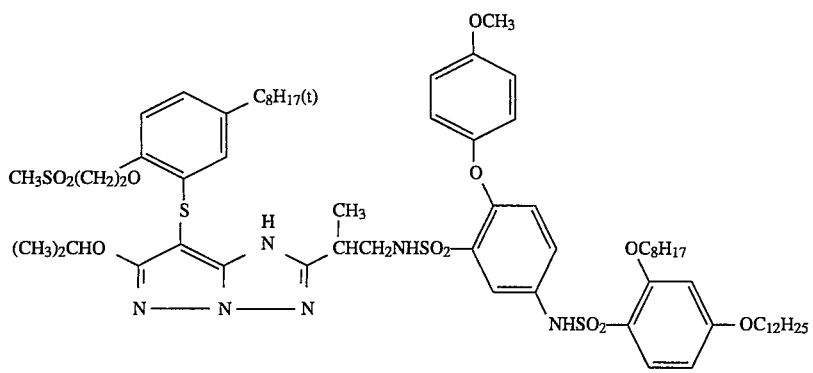
M-18

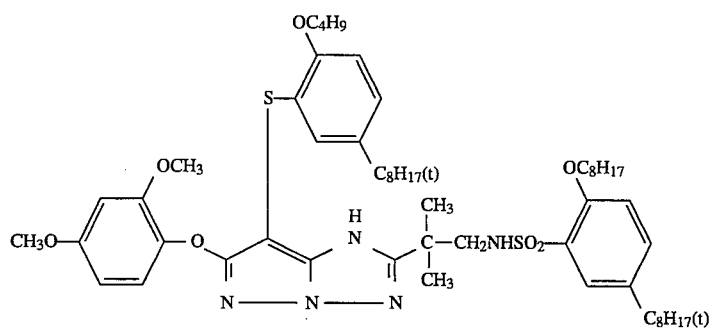
M-19

As additional examples, the compound may also include those except the above typical examples among the compounds M-1 to M-61 disclosed in European Patent Publication No. 0273712, pages 6–21 and the compounds 1 to 223 disclosed in the same, pages 36–92.

The above couplers can be synthesized by making reference to Journal of the Chemical Society, Perkin I (1977), 2047–2052, U.S. Pat. No. 3,725,067, Japanese Patent O.P.I. Publications No. 99437/1984, No. 42045/1983, No. 162548/1984, No. 171956/1984, No. 33552/1985, No. 43659/1985, No. 172982/1985, No. 190779/1985, No. 209457/1987 and No. 307453/1988.

The coupler described above may also be used in combination with magenta couplers of different types, and may be used usually in the range of from $1\times10^{-3}$ mol to 1 mol, and preferably from $1\times10^{-2}$ mol to $8\times10^{-1}$ mol, per mol of silver halide.

In the light-sensitive color photographic material of the present invention, $\lambda_{L0.2}$ of spectral absorption of magenta images may preferably be 850 to 635 nm.

In the light-sensitive silver halide color photographic material in which the $\lambda_{L0.2}$ is 580 to 635 nm, λmax of spectral absorption of magenta images may preferably be 530 to 560 nm.

Here, the $\lambda_{L0.2}$ and λmax of spectral absorption of magenta images pertaining to the light-sensitive silver halide color photographic material in the present invention are quantities measured by the following method.

—Measurement of $\lambda_{L0.2}$ and λmax—

In the case of positive types, a light-sensitive silver halide color photographic material is uniformly exposed to red light in a smallest amount of light at which a minimum density of a cyan image can be obtained, and also exposed to blue light in a smallest amount of light at which a minimum density of a yellow image can be obtained. Thereafter, the resulting light-sensitive material is exposed to white light through an ND filter, followed by photographic processing, where the density of the ND filter is adjusted so that a maximum value of absorbance comes to be 1.0 when an integrating sphere is fitted to a spectrophotometer, zero-correction is made using a magnesium oxide standard white card and spectral absorption of 500 to 700 nm is measured. A magenta image is thus produced.

In the case of negative types, the light-sensitive material is exposed to green light through an ND filter, followed by photographic processing to form a magenta image, where the density of the ND filter is adjusted so as to give the same maximum absorption as that in the above positive types. $\lambda_{L0.2}$ is meant to be a wavelength which is longer than a wavelength showing a maximum absorbance of 1.0 and shows an absorbance of 0.2, on a spectral absorbance curve of this magenta image.

difference of 2 or less, and more preferably 1.5 or less. A preferable yellow coupler contained in the magenta image forming layer of the present invention is a coupler represented by the following Formula Y-Ia. Of the coupler represented by Formula Y-Ia, when used in combination with the magenta coupler represented by Formula M-I, particularly preferred is a coupler having a pKa value not lower by at least 3 than a pKa value of the coupler represented by Formula M-I

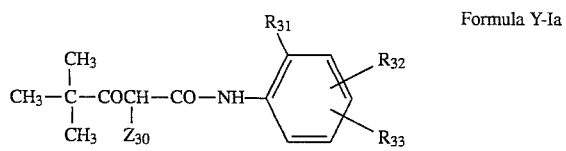

Formula Y-Ia

In Formula Y-Ia, $R_{31}$ represents a halogen atom or an alkoxyl group.

$R_{32}$ represents a halogen atom or an an alkoxyl group which may have a substituent. $R_{33}$ represents an acylamino group, an alkoxycarbonyl group, an alkylsulfamoyl group, an arylsulfamoyl group, an arylsulfonamido group, an alkylureido group, an arylureido group, a succinimido group, an alkoxyl group or an aryloxy group each of which may have a substituent.

$Z_{30}$ represents a hydrogen atom, a monovalent organic group capable of being split off upon coupling with an oxidized product of a color developing agent, or a halogen atom.

Specific examples of the compound are Y-1 and Y-2 shown below, and besides the compounds Y-1 to Y-58 disclosed in Japanese Patent O.P.I. Publication No. 139542/1990, pages 13–17, any of which may preferably be used. Examples are by no means limited to these as a matter of course.

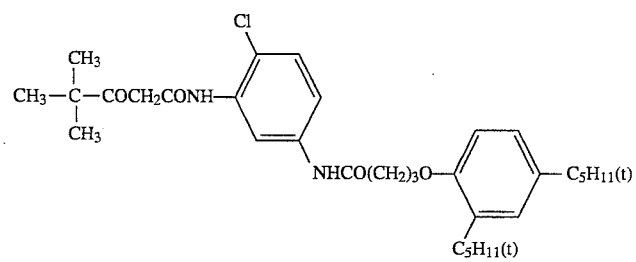

Y-1

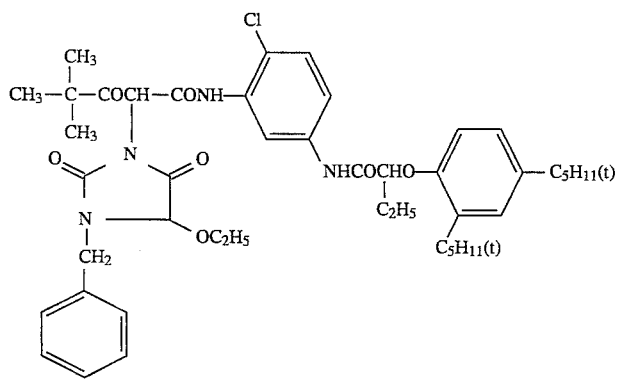

Y-2

In the magenta image forming layer of the light-sensitive silver halide photographic material according to the present invention, a yellow coupler is contained in addition to the magenta coupler. These couplers may preferably have a pKa The proportion of the content between the magenta coupler and the yellow coupler in the magenta image forming layer of the light-sensitive silver halide color photographic material according to the present invention may be determined so that the spectral absorption of the dye image obtained by color photographic processing of the magenta image forming layer may approximate the spectral absorption of a printed image obtained using a magenta printing ink. Stated specifically, it is suitable for the yellow coupler to be usually in a content ranging from 0.02 mol to 0.5 mol per mol of the magenta coupler.

As the yellow coupler contained in the magenta image forming layer of the light-sensitive silver halide color photographic material according to the present invention, the yellow coupler represented by the above Formula Y-Ia is preferably used.

In the present invention, the cyan coupler contained in the cyan image forming layer may include cyan dye forming couplers of a phenol type or naphthol type, any of which may be used.

Of these, a coupler represented by the following Formula C-I or C-II may preferably be used.

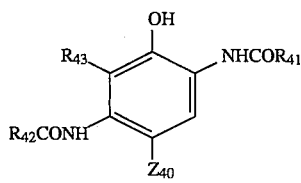

Formula C-I

In Formula C-I, $R_{41}$ represents an aryl group, a cycloalkyl group or a heterocyclic group. $R_{42}$ represents an alkyl group or a phenyl group. $R_{43}$ represents a hydrogen atom, a halogen atom, an alkyl group or an alkoxyl group.

$Z_{40}$ represents a hydrogen atom or a group capable of being split off upon reaction with an oxidized product of an aromatic primary amine type color developing agent.

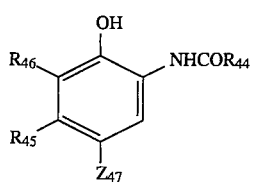

Formula C-II

In Formula C-II, $R_{44}$ represents an alkyl group as exemplified by a methyl group, an ethyl group, a propyl group, a butyl group and a nonyl group. $R_{45}$ represents an alkyl group as exemplified by a methyl group and an ethyl group. $R_{46}$ represents a hydrogen atom, a halogen atom as exemplified by fluorine, chlorine and bromine, or an alkyl group as exemplified by a methyl group and ethyl group. $Z_{47}$ represents a group capable of being split off upon reaction with an oxidized product of an aromatic primary amine type color developing agent.

These couplers are disclosed in U.S. Pat. Nos. 2,306,410, 2,356,475, 2,362,596, 2,367,531, 2,369,929, 2,423,730, 2,474,293, 2,476,008, 2,498,466 2,545,687, 2,728,660, 2,772,162, 2,895,826, 2,976,146, 3,002,836, 3,419,390, 3,446,622, 3,476,563, 3,737,316, 3,758,308 and 3,839,044, British Patents No. 478,991, No. 945,542, No. 1,084,480, No. 1,377,233, No. 1,388,024 and No. 1,543,040, and Japanese Patent O.P.I. Publications No. 37425/1972, No. 10135/1975, No. 25228/1975, No. 112038/1975, No. 117422/1975, No. 130441/1975, No. 6551/1976, No. 37647/1976, No. 52828/1976, No. 108841/1976, No. 109630/1978, No. 48237/1979, No. 66129/1979, No. 131931/1979, No. 32071/1980, No. 146050/1984, No. 31953/1984 and No. 117249/1985.

The couplers used in the present invention may each be usually used in an amount of from $1\times10^{-3}$ mol to 1 mol, and preferably from $1\times10^{-2}$ mol to $8\times10^{-1}$ mol, per mol of silver halide, in each silver halide emulsion layer.

The above couplers may be usually added by dissolving them in a high-boiling organic solvent having a boiling point of about 150° C. or above optionally together with a low boiling and/or water-soluble organic solvent, and carrying out emulsification dispersion in a hydrophilic binder such as an aqueous gelatin solution by the use of a surface active agent, followed by addition of the dispersion to an intended hydrophilic colloid layer. The step of removing the dispersing medium or, at the same time of the dispersion, removing the low-boiling organic solvent may be inserted.

In the present invention, the high-boiling organic solvent and low-boiling organic solvent according to the present invention may preferably be used in a proportion of 1:0.1 to 1:50, and more preferably from 1:1 to 1:20.

The high-boiling solvent according to the present invention may be any of compounds having a dielectric constant of 6.0 or less. Its lower limit is not particularly limitative, and preferably the dielectric constant may be 1.9 or more. Such a solvent is exemplified by esters such as phthalates and phosphates, organic amides, ketones and hydrocarbon compounds, having a dielectric constant of 6.0 or less. Phthalates or phosphates are more preferred.

In the light-sensitive silver halide photographic material according to the present invention, gelatin may preferably be used as a binder. In particular, a gelatin improved in its transmittance by treating a gelatin-extracted solution with hydrogen peroxide to remove coloring components of gelatin, by extracting gelatin from a starting material ossein having been treated with hydrogen peroxide or by using ossein produced from colorless raw bones may preferably be used.

The gelatin of the present invention may be any of alkali-treated ossein gelatin, acid-treated gelatin, gelatin derivatives and modified gelatin. In particular, alkali-treated ossein gelatin is preferred.

The gelatin used in the light-sensitive silver halide photographic material according to the present invention may preferably have a transmittance of 70% or more when a 10% solution is prepared and its transmittance is measured at 420 nm using a spectrophotometer. As a method for removing coloring components of gelatin to increase transmittance, the method mentioned above can be used. Preferable methods are a method in which a treatment with hydrogen peroxide is applied at the stage of the preparation of ossein, a method in which hydrogen peroxide is added to a liming bath used when ossein is limed, to cause it to react with ossein during liming, and a method in which hydrogen peroxide is used in a gelatin-extracted solution. A commercially available hydrogen peroxide solution may be used. The concentration of hydrogen peroxide, the addition and reaction time and the subsequent washing with water may be appropriately determined under optimum conditions for these.

Jelly strength (according to the PAGI method) of the gelatin of the present invention may preferably be 250 or more, and particularly preferably 270 or more.

There are no particular limitations on the proportion of the gelatin of the present invention to the total gelatin coated. It is preferable to use the former in a larger proportion to the latter. Stated specifically, its use in a proportion of 20% or more up to 100% can bring about preferable results.

The amount of gelatin contained in the light-sensitive material according to the present invention on its image forming layer side may preferably be less than 11 g/m$^2$ in total. There are no particular limitations on its lower limit.

In general, from the viewpoint of physical properties or photographic performance, the amount thereof may preferably be not less than 3.0 g/m². The amount of gelatin can be determined by the method of measuring water content as described in the PAGI method, calculating the measurements into the weight of gelatin containing 11.0% of water.

The yellow image forming layer, magenta image forming layer and cyan image forming layer of the present invention are formed in layers by coating on the support. Their formation from the support may be in any order. A preferred embodiment is, for example, that they are formed in the order of the cyan image forming layer, the magenta image forming layer and the yellow image forming layer from the side near to the support. In addition to these, an intermediate layer, a filter layer, a protective layer and so forth may optionally be provided.

The light-sensitive silver halide photographic material according to the present invention may preferably have a reflection density of 0.7 or more, as a reflection density of a raw sample at a maximum wavelength of spectral sensitivity of the cyan image forming silver halide emulsion layer. Such a light-sensitive silver halide photographic material can be obtained by incorporating any of the photographic component layers of the present invention with a coloring material such as a dye and black colloidal silver having an absorption at the above wavelength. In the light-sensitive color photographic material of the present invention, a water-soluble dye may be contained in any desired silver halide emulsion layer and/or a hydrophilic colloid photographic component layer other than that layer. In the light-sensitive color photographic material of the present invention, a dye having at least one of a carboxyl group, a sulfonamido group and a sulfamoyl group may be contained in any desired silver halide emulsion layer and/or a hydrophilic colloid photographic component layer other than that layer in a solid-dispersed state.

The dye having at least one of a carboxyl group, a sulfonamido group and a sulfamoyl group is more specifically exemplified by dyes represented by the following Formulas I to IX.

Formula I

In the formula, $R_1$ and $R_2$ each represent a hydrogen atom, an alkyl group, an alkenyl group, an aryl group, a heterocyclic group, $-COOR_5$, $-COR_5$, $-SO_2R_5$, $-SOR_5$, $-SO_2NR_5R_6$, $-CONR_5R_6$, $-NR_5R_6$, $-NR_5SO_2R_6$, $-NR_5COR_6$, $-NR_5CONR_6R_7$, $-NR_5CSNR_6R_7$, $-OR_5$, $-SR_5$ or a cyano group; and $R_3$ and $R_4$ each represent a hydrogen atom, an alkyl group, an alkenyl group, a cycloalkyl group, an aryl group or a heterocyclic group. $R_5$, $R_6$ and $R_7$ each represent a hydrogen atom, an alkyl group, an alkenyl group, an aryl group or a heterocyclic group. $L_1$ to $L_5$ each represent a methine chain. $n_1$ represents an integer of 0 or 1, and $n_2$ represents an integer of 0 to 2.

Formula II

In the formula, $R_1$, $R_3$, $L_1$ to $L_5$, $n_1$ and $n_2$ each have the same definition as in Formula I.

E represents an acidic nucleus necessary to form an oxonol dye.

Formula III

In the formula, $R_3$, $R_4$, $L_1$ to $L_5$, $n_1$ and $n_2$ each have the same definition as in Formula I. $R_8$ and $R_9$ have the same definition as $R_3$ and $R_4$, respectively.

Formula IV

In the formula, $R_3$, $L_1$ and $L_2$ each have the same definition as in Formula I, and E has the same definition as in Formula II. $R_{10}$ and $R_{11}$ each represent a hydrogen atom, an alkyl group, an alkenyl group, an aryl group, a heterocyclic group, a nitro group, a cyano group, a halogen atom, $-OR_5$, $-SR_5$, $-NR_5R_6$, $-NR_5SO_2R_6$, $-NR_5COR_6$, $-COR_5$ or $-COOR_5$. $R_{10}$ and $R_{11}$ may combine to form a cyclic double bond. $X_3$ each represent an oxygen atom, a sulfur atom, a selenium atom, $-C(R_{12})(R_{13})-$ or $-N(R_3)-$. $R_3$, $R_5$ and $R_6$ each have the same definition as in Formula I.

$R_{12}$ and $R_{13}$ each represent a hydrogen atom or an alkyl group. $n_3$ represents an integer of 1 to 3.

Formula V

In the formula, $R_3$, $R_4$, $L_1$, $L_2$, $L_3$ and $n_1$ each have the same definition as in Formula I, and E has the same definition as in Formula II. $R_{10}$ and $R_{11}$ each have the same definition as in Formula IV, and $R_{14}$ has the same definition as $R_{10}$.

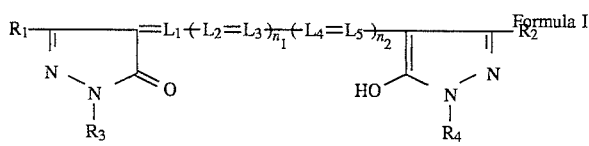

Formula VI

In the formula, $R_3$, $R_4$, $R_{10}$, $R_{11}$, $L_1$ to $L_5$, $X_3$, $n_1$ and $n_2$ each have the same definition as in Formula I, and $X_4$ has the same definition as $X_3$, and $R_{15}$ and $R_{16}$ each, as $R_{10}$.

$X^-$ represents a group having an anion. $R_{10}$ and $R_{11}$, and $R_{15}$ and $R_{16}$ may each combine to form a cyclic double bond.

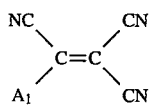

Formula VII

In the formula, $A_1$ represents a pyrrole nucleus, an imidazole nucleus, a pyrazole nucleus, a phenol nucleus, a naphthol nucleus or a condensed heterocyclic ring.

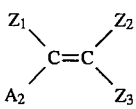

Formula VIII

In the formula, $Z_1$, $Z_2$ and $Z_3$ each represent an electron-attractive group, and $A_2$ represent an aryl group or a heterocyclic group.

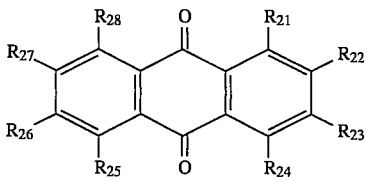

Formula IX

In the formula, $R_{21}$, $R_{22}$, $R_{23}$ and $R_{24}$ each represent a hydrogen atom, a hydroxyl group, —$OR_{29}$ or an —$N(R')R''$ group, wherein $R_{29}$ represents an alkyl group or an allyl group, R' and R'' each represent a hydrogen atom or an alkyl group or allyl group having at least one sulfonic acid group or carboxylic acid group. $R_{25}$, $R_{26}$, $R_{27}$ and $R_{28}$ each represent a hydrogen atom, a carboxylic acid group, a sulfonic acid group or an alkyl group or allyl group having at least one carboxylic acid group or sulfonic acid group.

Examples of the dyes represented by Formulas I to IX are, e.g., Nos. 1 to 85 disclosed in Japanese Patent O.P.I. Publication No. 26850/1989, pages 7–11; Nos. 1 to 103 disclosed in Japanese Patent O.P.I. Publication No. 97940/1990, pages 5–9; I-1 to VIII-7 disclosed in Japanese Patent O.P.I. Publication No. 18545/1992, pages 13–35; and II-1 to -19 disclosed in Japanese Patent O.P.I. Publication No. 253146/1987, pages 12–13. Examples are by no means limited to these.

These dye compounds are compounds that are substantially water-insoluble (in water of pH 7 or less) and has hydrophilic groups capable of dissociating at pH 9 or more. The dyes may be made present in gelatin or in a high-molecular weight binder in the state of a solid fine particle dispersion (which is in the form of solid particles of a microscopic size, preferably having an average particle diameter of 10 μm or less, and more preferably 1 μm or less) obtained by a method in which the compounds are formed into fine particles by means of a ball mill, a sand mill or the like or a method in which they are dissolved in an organic solvent followed by dispersion in a gelatin solution, and thus can be incorporated into any desired light-sensitive emulsion layer and non-sensitive hydrophilic colloid layer among the photographic component layers.

This solid fine particle dispersion of dye is water-insoluble and stably present in the light-sensitive color photographic material, but, after exposure and as a result of processing using a color developing solution (desirably of pH 9 or more), the hydrophilic groups in the dye compound undergo dissociation to make the dispersion water-soluble or decolored, so that the greater part of the dispersion disappears from the light-sensitive color photographic material.

There are no particular limitations on the layer in which the above dye or colloidal silver is contained. It is preferable for it to be contained in a non-sensitive hydrophilic colloid layer present between the support and an emulsion layer nearest to the support.

The gelatin contained in the light-sensitive emulsion layer and non-sensitive hydrophilic colloid layer among the photographic component layers of the light-sensitive color photographic material of the present invention, formed on the side of the support on which silver halide emulsions are coated, may be in an amount of not more than 13 g, and preferably from not less than 5 g to less than 12 g, in total per 1 $m^2$ of the light-sensitive material.

The silver halides in the present invention may be optically sensitized using spectral sensitizers conventionally used. Spectral sensitizers used in supersensitization of internal latent image forming silver halide emulsions, negative silver halide emulsions and so forth may be used in combination. This is useful also for the silver halide emulsions of the present invention. As to the spectral sensitizers, reference may be made to Research Disclosures (hereinafter "RD") 15162 and 17643.

In the present invention, the black image forming layer may be obtained by any conventionally known methods so long as a black image is formed after development. For example, an image formed by making a silver image remain after photographic processing may-be utilized. A black coupler capable of forming a black image by color development may also be used. It is also possible to obtain a black image by mixing a yellow coupler, a magenta coupler and a cyan coupler.

In the light-sensitive silver halide photographic material of the present invention, preferred is a light-sensitive silver halide color photographic material in which the maximum density of each single color of yellow, magenta and cyan pertaining respectively to the yellow image forming layer, magenta image forming layer and cyan image forming layer having been subjected to photographic processing having a color developing step is in the range of from 1.50 to 1.90, and also each color component density of the respective black colors, obtained by adding a maximum density of the black image forming layer to the maximum density of each single color, is 1.90 or more.

In the light-sensitive silver halide photographic material of the present invention, preferred is a light-sensitive silver halide color photographic material in which the toe gradient of each single color of yellow, magenta and cyan pertaining respectively to the yellow image forming layer, magenta image forming layer and cyan image forming layer having been subjected to photographic processing having a color developing step is 1.7 or more. Herein, the toe gradient is represented by an absolute value of a straight line that connects, in the characteristic curve, a point showing a density 0.15 on the minimum density and a point showing a density 0.80 on the minimum density.

As a method of increasing the toe gradient, there is, for example, a method of narrowing the grain size distribution of grains in silver halide emulsions. For example, in the case of color developing solutions, the amount of a color developing agent may be increased, the amount of hydroxylamine or sulfite as a preservative may be decreased and its counterpart may be substituted with a weak reducing agent such as xylol or sorbitol, the amount of a penetrant (e.g., benzyl alcohol) may be increased, or the pH and temperature of processing solutions, and developing time may be raised or elongated while adding an antifoggant and a toe-chopping agent.

In the case of light-sensitive materials, hydroquinone derivatives having an ability of reducing an oxidized developing agent can be effectively used in the light-sensitive materials. In particular, as a compound effective for increasing the toe gradient without any bad influence on hues and so forth, they include a compound of Formula AO-I or AO-II.

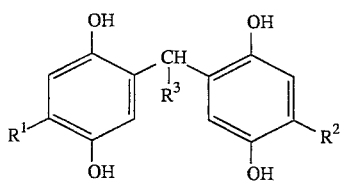

Formula AO-I

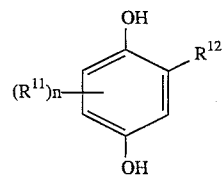

Formula AO-II

In Formula AO-I, $R^1$ and $R^2$ each represent a hydrogen atom, or an alkyl group (e.g., methyl, ethyl, t-butyl or sec-hexyl), an alkoxyl group (e.g., methoxy, ethoxy or butoxy), an alkylthio group (e.g., methylthio, butylthio or octylthio) or an alkylamido group (e.g., methaneamido, propaneamido or 2-ethylpentanoylamido) each having 1 to 8 carbon atoms. $R^3$ represents a hydrogen atom or an alkyl group having 1 to 11 carbon atoms as exemplified by methyl, propyl, heptyl or undecyl. $R^1$ and $R^2$ each may preferably represent an alkyl group having 1 to 6 carbons atoms, and $R^3$ may preferably represent an alkyl group having 1 to 7 carbon atoms.

The total carbon atom number of $R^1$, $R^2$ and $R^3$ is 8 to 22, and preferably 8 to 17.

In Formula AO-II, $R^{11}$ and $R^{12}$ each represent a hydrogen atom or an alkyl group having 1 to 5 carbon atoms as exemplified by methyl, ethyl, i-propyl, butyl, t-butyl, pentyl, t-pentyl or neo-pentyl, and n is an integer of 1 to 3.

The compound of Formula AO-I can be synthesized by the method disclosed in Japanese Patent O.P.I. Publication No. 146235/1977 and Japanese Patent Examined Publications No. 21145/1981 and No. 37497/1984. Specific compounds thereof may include, for example, I-(1) to I-(12) disclosed in Japanese Patent O.P.I. Publication No. 30164/1992, pages 67–69.

Typical examples of the compound of Formula AO-II are shown below. Examples are by no means limited to these.

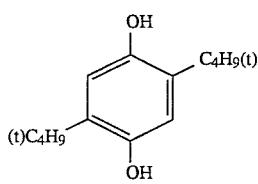

II-1

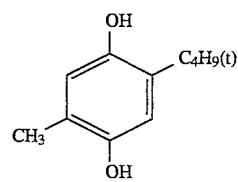

II-2

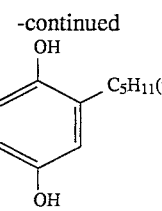

II-3

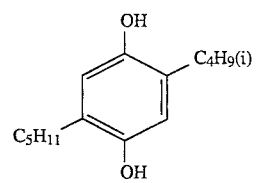

II-4

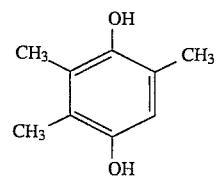

II-5

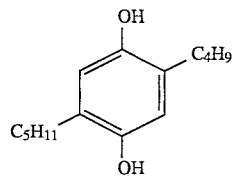

II-6

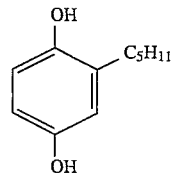

II-7

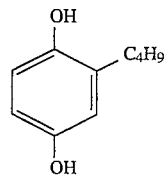

II-8

The compound of Formula AO-I may be added in an amount ranging from $2\times10^{-8}$ to $2\times10^{-2}$ mol/m², preferably from $2\times10^{-7}$ to $2\times10^{-3}$ mol/m², and more preferably from $2\times10^{-6}$ to $2\times10^{-4}$ mol/m².

The compound of Formula AO-II may preferably be added in an amount of from 0.001 to 0.50 g/m², and more preferably from 0.005 to 0.20 g/m². The compound may be used alone or may be used in combination of two or more kinds. A quinone derivative having 5 or more carbon atoms may also be added to the compound of Formula AO-II. In any of these instances, the compound should preferably be used in an amount ranging from 0.001 to 0.50 g/m².

The fogging treatment in the formation of internal latent image direct positive images preferably used in the present invention may be carried out by applying overall exposure or using a compound capable of producing fog specks, i.e., a fogging agent.

The overall exposure is carried out by immersing an imagewise exposed light-sensitive material in, or wetting it with, a developing solution or other aqueous solution, followed by uniform exposure over the whole surface. A light source used here may be any light source so long as it can emit light having a light-sensitive wavelength region pertaining to the light-sensitive photographic material. It is also possible to apply highly luminant light such as flash light for a short time, or apply weak light for a long time. The time for the overall exposure can be changed in a wide range so that a best positive image can be finally obtained, depending on the light-sensitive photographic material, the conditions of photographic processing and the type of the light source used. With regard to the amount of exposure in the overall exposure, it is most preferable to give an amount of exposure within a range predetermined in combination with the light-sensitive material. In usual instances, exposure carried out in an excessive amount tends to cause an increase in minimum density or a desensitization, bringing about a lowering of image quality.

The fogging agent preferably used in the present invention will be described below.

Extensively various kinds of compounds can be used as the fogging agent used in the present invention. It is enough for this fogging agent to be present at the time of photographic processing. For example, it may be incorporated into component layers other than the support (in particular, preferably into silver halide emulsion layers), of the light-sensitive photographic material, or into a developing solution or a processing solution preceding to photographic processing. The amount of the fogging agent used may vary in a vast range depending on purpose. When the fogging agent is added in a silver halide emulsion layer, it may preferably be used in an amount of from 1 to 1,500 mg, and more preferably from 10 to 1,000 mg, per mol of silver halide. When added in a processing solution such as a developing solution, it may preferably be added in an amount of from 0.01 to 5 g/liter, and particularly preferably from 0.05 to 1 g/liter.

The fogging agent used in the present invention may include compounds having a group adsorptive to the surface of silver halide, as exemplified by the hydrazines as disclosed in U.S. Pat. Nos. 2,563,785 and 2,588,982, the hydrazide or hydrazine compounds as disclosed in U.S. Pat. No. 3,227,552, the heterocyclic quaternary nitrogen salt compounds as disclosed in U.S. Pat. Nos. 3,615,615, 3,718, 479, 3,719,494, 3,734,738 and 3,759,901, and also the acylhydrazinophenylthioureas as disclosed in U.S. Pat. No. 4,030,925. Any of these fogging agents may be used in combination. For example, RD15162 previously noted discloses to use a non-adsorptive fogging agent in combination with an adsorptive fogging agent. This technique of using them in combination is also effective in the present invention. The fogging agent used in the present invention may be either adsorptive or non-adsorptive, any of which may be used or both of which may be used in combination.

Useful fogging agents can be exemplified by hydrazine compounds such as hydrazine hydrochloride, 4-methylphenylhydrazine hydrochloride, 1-acetyl-2-phenylhydrazine, 1-formyl-2-(4-methyl)phenylhydrazine, 1 -methylsulfonyl-2-phenylhydrazine, 1-methylsulfonyl-2-(3-phenylsulfonamidophenyl)hydrazine, 1-benzoyl-2-phenylhydrazine and formaldehyde phenylhydrazine; N-substituted quaternary cycloammonium salts such as 3-(2 -formylethyl)-2-methylbenzothiazolium bromide, 3-(2 -acetylethyl)-2-benzyl-5-phenylbenzooxazolium bromide, 3-(2 -acetylethyl)-2-benzylbenzoselenazolium bromide, 2-methyl-3 -[3-(phenylhydrazino)propyl]benzothiazolium bromide, 1,2 -dihydro-3-methyl-4-phenylpyrido[2,1-b]benzothiazolium bromide, 1,2-dihydro-3-methyl-4-phenylpyrido[2,1-b]benzoselenazolium bromide and 4,4'-ethylenebis(1,2 -dihydro-3-methylpyrido[2,1-b]benzothiazolium bromide; 5-(3 -ethyl-2-benzothiazolinylidene)-3-[4-(2-formylhydrazino)phenyl] rhodanine, 1,3-bis[4-(2-formylhydrazino)phenyl]thiourea, 7-(3-ethoxycarbonylaminobenzamido)-9-methyl-10-propagyl-1,2,3,4-tetrahydroacridiniumtrifluoromethane sulfonate, and 1-formyl-2-[4-{3-(2-methoxyphenyl)ureido}phenyl]hydrazine.

The light-sensitive photographic material having the silver halide emulsion layers according to the present invention is, after imagewise exposure, subjected to overall exposure or photographic processing in the presence of the fogging agent, thereby to form a direct positive image.

Developing agents usable in the developing solution used in the development of the light-sensitive photographic material according to the present invention may include usual silver halide developing agents as exemplified by polyhydroxybenzenes such as hydroquinone, aminophenols, 2-pyrazolidones, ascorbic acid and derivatives thereof, reductones and phenylenediamines, or mixtures of any of these. Stated specifically, they may include hydroquinone, aminophenol, N-methylaminophenol, 1 -phenyl-3-pyrazolidone, 1-phenyl-4,4-dimethyl-3-pyrazolidone, 1-phenyl-4-methyl-4-hydroxymethyl-3-pyrazolidone, ascorbic acid, N,N-diethyl-p-phenylenediamine, diethylamino-o-toluidine, 4-amino-3 -methyl-N-ethyl-N-(β-methanesulfonamidoethyl)aniline, 4 -amino-3-methyl-N-ethyl-N-(β-hydroxyethyl)aniline and 4 -amino-N-ethyl-N-(β-hydroxyethyl)aniline. Any of these developing agents may be previously incorporated into an emulsion so that they act on silver halides while being immersed in a high-pH aqueous solution.

The light-sensitive color photographic material according to the present invention may preferably contain a nitrogen-containing heterocyclic compound having a mercapto group, represented by the following Formula XI (hereinafter called the mercapto compound).

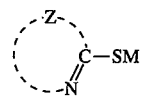

Formula XI

In the formula, M represents a hydrogen atom, an alkali metal atom, an ammonium group, or a protective group of the mercapto group, and Z represents a group of non-metal atoms necessary to complete a heterocyclic ring. The heterocyclic ring may have a substituent or may be condensed.

The protective group of the mercapto group, represented by M is a group capable of forming a mercapto group upon cleavage caused by an alkali, and may specifically include an acyl group, an alkoxycarbonyl group and an alkylsulfonyl group.

The nitrogen-containing heterocyclic group may have a carbon atom, a nitrogen atom, an oxygen atom, a sulfur atom, a selenium atom or the like as a ring constituent atom, and may preferably be of 5 or 6 members. Examples of the heterocyclic ring may be imidazole, benzimidazole, naphthimidazole, thiazole, thiazoline, benzothiazole, naphthothiazole, oxazole, benzoxazole, naphthoxazole, selenazole, benzoselenazole, naphthoselenazole, triazole, benzotriazole, tetrazola, oxadiazole, thiadiazole, pyridine, pyrimidine, triazine, purine and azaindene.

The substituent these heterocyclic rings may have may include, for example, a halogen atom and groups such as hydroxyl, amino, nitro, mercapto, carboxyl and salts thereof, sulfo and salts thereof, alkyl, alkoxyl, aryl, aryloxy, alkylthio, arylthio, acylamino, sulfonamido, carbamoyl and sulfamoyl.

Of the compound represented by Formula XI, compounds particularly preferably used can be represented by the following Formulas XII, XIII and XIV.

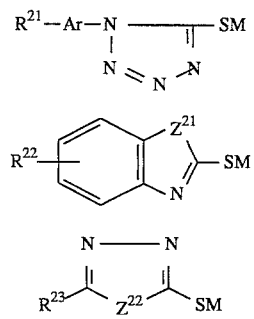

Formula XII

Formula XIII

Formula XIV

In Formulas XII to XIV, M has the same definition as M in Formula XI. $R^{21}$ and R22 each represent a group that can be substituted on the benzene ring; Ar represents a phenyl group; $R^{23}$ represents a halogen atom or a group such as hydroxyl, amino, nitro, mercapto, carboxyl or a salt thereof, alkyl, alkoxyl, aryl, aryloxy, alkylthio, arylthio, acylamino, sulfonamido or carbamoyl; and $Z^{21}$ and $Z^{22}$ each represent an oxygen atom, a sulfur atom or —NH—.

Examples of the compound represented by Formula XI may be compounds 1 to 39 disclosed in Japanese Patent O.P.I. Publication No. 73338/1989, pages 11–15.

These compounds can be readily synthesized by known methods. For example, they can be obtained by the methods disclosed in U.S. Pat. Nos. 2,403,927 and 3,376,310, Japanese Patent O.P.I. Publication No. 59463/1980, Journal of the Chemical Society (J. Chem. Soc.), 1952, page 4237, etc. Some of the compounds are also commercially available.

The mercapto compound of the present invention may be added to the light-sensitive material by dissolving it in water or an organic solvent having an affinity for water as exemplified by methanol or acetone, or by dissolving in a weak alkali or a weak acid. The amount of the compound added may appropriately vary depending on the type of the compound used or the layer to which it is added. When the compound is added to a silver halide emulsion layer, it may usually be added in an amount ranging from $10^{-8}$ to $10^{-2}$ mol, and more preferably from $10^{-6}$ to $10^{-3}$ mol, per mol of silver halide.

The developing solution used in the present invention may further contain a specific antifoggant and a specific development restrainer, or such developing solution additives may be arbitrarily incorporated into any component layers of the light-sensitive photographic material.

In the light-sensitive silver halide photographic material according to the present invention, known photographic additives may be used.

Such known photographic additives may include, for example, compounds disclosed in RD17643 and RD18716 shown below.

| Additives | RD-17643 | | RD-18716 | |
|---|---|---|---|---|
| | Page | Paragraph | Page | Column |
| Chemical sensitizer: | 23 | III | 648 | right, upper |
| Sensitizing dye: | 23 | IV | 648 | right, upper |
| Development accelerator: | 29 | XXI | 648 | right, upper |
| Antifoggant: | 24 | VI | 649 | right, lower |
| Stabilizer: | 24 | VI | 649 | right, lower |
| Anti-color-stain agent | 25 | VII | 650 | left to right |
| Image stabilizer: | 25 | VII | | |
| Ultraviolet absorbent: | 25–26 | VIII | 649 | right to 650 left |
| Filter dye: | 25–26 | VIII | 649 | right to 650 left |
| Brightener: | 24 | V | 650 | left |
| Hardening agent: | 26 | X | 651 | right |
| Coating aid: | 26–27 | XI | 650 | right |
| Surfactant: | 26–27 | XI | 650 | right |
| Plasticizer: | 27 | XII | 650 | right |
| Lubricant: | 27 | XII | 650 | right |
| Antistatic agent: | 27 | XII | 650 | right |
| Matting agent: | 28 | XVI | 650 | right |
| Binder: | 26 | IX | 651 | right |

In the emulsion layers of the light-sensitive material according to the present invention, a dye forming coupler capable of forming a dye upon coupling reaction with an oxidized product of a color developing agent may be used. It is common for the dye froming coupler to be selected so that a dye capable of absorbing spectral light to which an emulsion layer is sensitive is formed for each emulsion layer. Thus, a yellow dye froming coupler is used in a blue-sensitive emulsion layer, a magenta dye froming coupler in a green-sensitive emulsion layer, and a cyan dye froming coupler in a red-sensitive emulsion layer. However, depending on the purpose, the light-sensitive silver halide color photographic material may also be prepared by a method in which the couplers are used in the manner different from the above combination.

These dye forming couplers should each preferably have in the molecule a group having 8 or more carbon atoms, called a ballast group, which is capable of making the coupler non-diffusible. These dye forming couplers may be either of a four-equivalent character wherein four molecules of silver ions must be reduced for the formation of one molecule of the dye, or of a two-equivalent character wherein only two molecules of silver ions may be reduced. A DIR coupler capable of releasing a development restrainer as development proceeds and improving the sharpness of images or the graininess of images, or a DIR compound capable of producing a colorless compound upon coupling reaction with an oxidized product of a developing agent and at the same time releasing a development restrainer may be used.

The DIR coupler and DIR compound used include those in which the restrainer has been directly bonded to the coupling position and those in which the restrainer has been bonded to the coupling position through a divalent group and has been so bonded that the restrainer is released as a result of intramolecular nucleophilic reaction or intramolecular electron transfer reaction occurring in the group having been split off upon the coupling reaction (called timing DIR couplers and timing DIR compounds, respectively).

It is also possible to use the dye froming coupler in combination with a colorless coupler (also called a competing coupler) capable of undergoing coupling reaction with an oxidized product of an aromatic primary amine developing agent but forming no dye.

As the yellow dye forming coupler, known acylacetoanilide type couplers can be preferably used. Of these, it is advantageous to use benzoylacetanilide compounds and pivaloylacetanilide compounds.

In the present invention, $\lambda_{L0.2}$ of a yellow image may preferably be 515 nm.

The $\lambda_{L0.2}$ in the present invention refers, in a yellow image whose absorbance Amax in a wavelength λmax corresponding to a maximum value Amax of spectral absorbance A(λ) of a yellow image is higher by 1.0±0.05 than Am on the basis of an average value Am as defined below of absorbance 560 to 650 nm in the spectral absorbance A(λ) of the yellow image;

$$\left( Am = \frac{\int_{560}^{650} A d\lambda}{650-560} \right)$$

to a wavelength positioned on the side longer than the above λmax and also corresponding to absorbance A=0.8× Am+0.2×Amax. $\lambda_{L0.8}$ refers to a wavelength showing A=0.2×Am+0.8×Amax.

The Amax is an absorbance at the λmax of the yellow image, and is usually seen at 400 nm or more. If a maximum value of a color image is not seen because of any interposition of other factors such as an ultraviolet absorbent, the Amax represents an absorbance at a wavelength whose absolute value |dA/dλ| of dA/dλ is smallest among 400 to 500 nm, in other words, an absorbance at the shoulder.

The yellow image is an image formed by controlling the conditions for separation exposure so that a value of Amax minus Am comes to be 1.0±0.05, followed by development.

In the present invention, the yellow image may preferably have a spectral absorption of $\lambda_{L0.8}$>450 nm, and more preferably $\lambda_{L0.8}$>455 nm. The $\lambda_{L0.2}$ may preferably be 510 or less. The λmax may preferably be 430 nm or more.

In the present invention, the spectral absorbance was measured using a Hitachi-320 type spectrophotometer fitted with an integrating sphere.

In the case when the light-sensitive material of the present invention is a light-sensitive material making use of a coupler as the substance capable of forming yellow images, any couplers may be used so long as the above condition is satisfied. As a preferred coupler, the coupler may include a coupler represented by Formula Y-I.

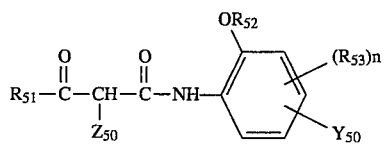

Formula Y-I

In the formula, $R_{51}$ represents an alkyl group or a cycloalkyl group; $R_{52}$ represents an an alkyl group, a cycloalkyl group, an acyl group or an aryl group; $R_{53}$ represents a group capable of being substituted on the benzene ring; n represents 0 or 1; $Y_{50}$ represents a monovalent ballast group; $Z_{50}$ represents a hydrogen atom or a group capable of being split off at the time of coupling.

Examples of the above coupler are compounds disclosed in Japanese Patent O.P.I. Publication No. 241345/1991, pages 5–9, i.e., compounds shown as Y-I-1 to Y-I-55, any of which can be preferably used. Compounds disclosed in Japanese Patent O.P.I. Publication No. 209466/1991, pages 11–14, i.e., compounds shown as Y-1 to Y-30 can also be preferably used.

These couplers may be used usually in a silver halide emulsion layer and in an amount ranging from $1\times 10^{-3}$ to 1 mol, and preferably from $1\times 10^{-2}$ to $8\times 10^{-1}$ mol, per mol of silver halide.

As the cyan dye froming coupler, known phenol type, naphthol type or imidazole type couplers may be used. For example, they are typified by phenol type couplers substituted with an alkyl group, an acyl amino group or a ureido group, naphthol type couplers formed of a 5-aminonaphthol skeleton, and two-equivalent naphthol type couplers in which an oxygen atom has been introduced as an eliminable group.

In the light-sensitive material of the present invention, high-boiling solvents used in combination with couplers may be of any types. In combination with the magenta coupler represented by Formula M-I and the yellow coupler represented by Formula Y-I, an organic solvent represented by the following Formula HBS-I or HBS-II may preferably be used.

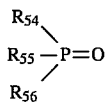

Formula HBS-I

In Formula HBS-1, $R_{54}$, $R_{55}$ and $R_{56}$ each represent an alkyl group or an aryl group, and at least two of $R_{54}$, $R_{55}$ and $R_{56}$ each represent an alkyl group having 1 to 16 carbon atoms.

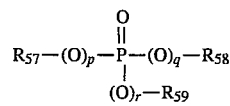

Formula HBS-II

In Formula HBS-II, $R_{57}$, $R_{58}$ and $R_{59}$ each represent an aliphatic group or an aromatic group, and p, q and r each represent 0 or 1, provided that p, q and r are each not 1 at the same time.

Specific compounds of the compounds of Formula HBS-I or Formula HBS-II can be exemplified by compounds I-1 to II-95 disclosed in Japanese Patent O.P.I. Publication No. 124568/1990, pages 53–68. Of course, examples are by no means limited to these.

In the magenta image forming layer of the light-sensitive color photographic material of the present invention, it is preferable to use the yellow coupler in combination with the magenta coupler in order to make its toner close to that of the printing ink.

An oil-soluble dye may preferably be used in the present invention, which refers to an organic dye having a solubility of $1\times 10^{-2}$ or less as a solubility in water at 20° C. [g/100 g water] (the weight of substance dissolving in 100 g of water). As typical compounds, it may include anthraquinone type compounds and azo type compounds The oil-soluble dye according to the present invention may preferably have a molecular extinction coefficient (solvent: chloroform) of 5,000 or more, and more preferably 20,000 or more, at the maximum absorption wavelength in a wavelength of 400 nm or longer.

The oil-soluble dye preferably usable in the light-sensitive material of the present invention may preferably be used in a coating weight of from 0.01 mg/m² to 10 mg/m², and more preferably from 0 05 mg/m² to 5 mg/m².

The oil-soluble dye used in the present invention may be used in any photographic emulsion layers It is more preferable for it to be added to a non-sensitive layer other than coupler-containing layers.

The manner in which the oil-soluble dye according to the present invention can be particularly preferably used is that an oil-soluble dye having a molecular extinction coefficient of 20,000 or more at the maximum absorption wavelength in a wavelength of 400 nm or longer is incorporated into a non-sensitive layer other than coupler-containing layers in a coating weight of from 0.05 mg/m² to 5 mg/m².

Preferable oil-soluble dyes used in the present invention may include compounds 1 to 27 disclosed in Japanese Patent O.P.I. Publication No. 842/1990, pages 8–9, and compounds 1 to 27 disclosed in Japanese Patent Application No. 226014/1992, paragraphs 0116–0119. Examples are by no means limited to these.

A fluorescent brightening agent may preferably be incorporated into the light-sensitive material of the present invention and/or a processing solution with which the light-sensitive material is processed.

The fluorescent brightening agent includes fluorescent brightening agents of a stilbene type, a triazone type, an imidazolone type, a pyrazolidone type, a triazole type, a cumarine type, an acetylene type, an oxazole type or an oxadiazole type, which may preferably be used. These fluorescent brightening agents are disclosed in U.S. Pat. Nos. 2,571,706, 2,581,057, 2,618,639, 2,702,296, 2,713,054, 2,715,630, 2,723,197, 3,269,840, 3,513,102, 3,615,544, 3,615,547, 3,684,729, 3,788,854 and 3,789,012, British Patents No. 669,590, No. 672,803 and No. 712,764, Danish Patent No. 74,109, German Patent No. 911,368, German Patent Application Publication (OLS) No. 25 25 680, Japanese Patent Examined Publication No. 7127/1959, etc. These compounds may be water-soluble ones, or may be water-insoluble ones used in the form of dispersions.

A developing solution, a bleach-fixing solution and a stabilizing solution which are used for the processing of the light-sensitive silver halide photographic material of the present invention may be used while respectively replenishing them with a replenishing developing solution, a replenishing bleaching solution, a replenishing fixing solution, a replenishing bleach-fixing solution and a replenishing stabilizing solution, to continuously carry out the photographic processing. In the present invention, the invention can be more effective when the developing solution is replenished in an amount of not more than 700 cc per 1 m² of the light-sensitive material. The present invention can be still more effective when replenished in an amount of not more than 500 cc. Other processing solutions may also be considered similarly to the developing solution, and the present invention can be more effective when replenished in an amount of not more than 700 cc, and more preferably not more than 500 cc, per 1 m² of the light-sensitive material.

In the present invention, an ultraviolet absorbent which is liquid at room temperature may be used. In the present invention, the term "liquid at room temperature" indicates that, at 25° C., the compound has no specific form, has a fluidity and has substantially a fixed volume as defined in ENCYCLOPEDIA CHEMICA, Kyoritsu Shuppan Co., (1963). Thus, there are no particular limitations on its melting point so long as the compound has the above properties. It may preferably have a melting point of 30° C. or below, and particularly preferably 15° C. or below.

The liquid ultraviolet absorbent may have any structure so long as what is described above is satisfied. In view of light-fastness of the ultraviolet absorbent itself, 2-(2-hydroxyphenyl)benzotriazole compounds are preferred. Preferred ultraviolet absorbents usable in the present invention may include compounds UV-1L to UV-27L disclosed in Japanese Patent Application No. 107780/1992, paragraphs 0027–0028. Examples are by no means limited to these.

The liquid ultraviolet absorbent according to the present invention may be added in any amount. It may be used in an amount ranging from 0.1 to 300% by weight, preferably from 1 to 200% by weight, and more preferably from 5 to 100% by weight, based on the weight of the binder in a photographic component layer containing the ultraviolet absorbent. It may also preferably be used in a coating weight of from 0.01 to 100 mg/100 cm², more preferably from 0.1 to 50 mg/100 cm², and particularly preferably from 0.5 to 30 mg/100 cm².

The layer containing the liquid ultraviolet absorbent of the present invention may be any of the photographic component layers of the present invention. Preferably at least 60% by weight, and more preferably at least 80% by weight, of the whole liquid ultraviolet absorbent contained in the light-sensitive material may be contained in a photographic component layer present at the position farther than a light-sensitive silver halide emulsion layer which is farthest from the support.

In the present invention, at least one of non-sensitive layers may contain a compound represented by Formula H-I.

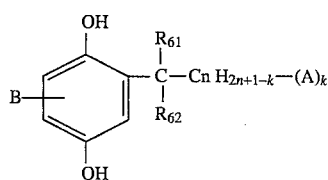

Formula H-I

In Formula H-I, $R_{61}$ and $R_{62}$ each represent an alkyl group having 1 to 5 carbon atoms, as exemplified by a methyl group, an ethyl group, a n-propyl group, an i-propyl group, a n-butyl group, a s-butyl group, a n-pentyl group or a neopentyl group. Letter symbol n represents an integer of 1 to 20, and preferably an integer of 2 to 15. Letter symbol k represents 1 or 2. Letter symbol A represents —CO—XR$_{63}$, wherein X represents —O— or —N(R$_{64}$)— and R$_{63}$ represents a hydrogen atom, an alkyl group, an alkenyl group, a cycloalkyl group or an aryl group, where R$_{64}$ represents a hydrogen atom, an alkyl group or an aryl group; —OY, wherein Y represents R$_{63}$ or —CO—R$_{63}$, where R$_{63}$ has the same definition as the above; —N(R$_{64}$)R$_{65}$, wherein R$_{64}$ has the same definition as the above and R$_{65}$ represents a hydrogen atom, an alkyl group, an aryl group or —C—R$_{63}$, where R$_{63}$ has the same definition as the above; —PO—(OR$_{63}$—{(O)$_l$R$_{66}$}, wherein l represents 0 or 1, R$_{63}$ has the same definition as the above, R$_{66}$ represents a hydrogen atom, an alkyl group, a cycloalkyl group, an alkenyl group or an aryl group; or a cyano group. B represents an alkyl group, an alkenyl group, a cycloalkyl group, an aryl group, a heterocyclic group or a group represented by the formula:

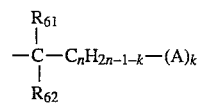

wherein $R_{61}$, $R_{62}$, n, k and A have the same definitions as in the above, where the alkyl group, alkenyl group, cycloalkyl group or aryl group represented by R$_{63}$, the alkyl group or aryl group represented by R$_{64}$, the alkyl group or aryl group represented by R$_{65}$, the alkyl group, cycloalkyl group, alkenyl group or aryl group represented by R$_{66}$ and the alkyl group, alkenyl group, cycloalkyl group, aryl group or heterocyclic group represented by B each include those having a substitutent. The substituent of the alkyl group may include, for example, a halogen atom, a cycloalkyl group, an alkenyl group, an aryl group, an alkoxyl group, an aryloxy group, an acyl group, a heterocyclic group and a cyano group; the substituent of the alkenyl group, cycloalkyl group, aryl group or heterocyclic group may include, for example, a halogen atom, an alkyl group, a cycloalkyl group, an alkenyl group, an aryl group, an alkoxyl group, an aryloxy group, an acyl group, a heterocyclic group and a cyano group.

The alkyl group represented by $R_{63}$, $R_{64}$, $R_{65}$, $R_{66}$ and B each may include, for example, a methyl group, an ethyl group, a n-propyl group, a n-butyl group, a s-butyl group, a n-hexyl group, a 2-ethyl-hexyl group, a n-dodecyl group, a n-hexadecyl group and a benzyl group; the alkenyl group represented by $R_{63}$, $R_{66}$ and B each may include, for example, an aryl group; the cycloalkyl group represented by $R_{63}$, $R_{66}$ and B each may include, for example, a cycloalkyl group; and the aryl group represented by $R_{63}$, $R_{64}$, $R_{65}$, $R_{66}$ and B each may include, for example, a phenyl group and a naphthyl group.

The compound represented by the above Formula H-I may more preferably be a compound represented by the following Formula H-I-1, or a precursor thereof.

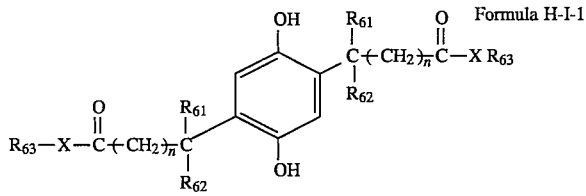

In the formula, $R_{61}$, $R_{62}$, $R_{63}$, X and n have the same definitions as $R_{61}$, $R_{62}$, $R_{63}$, X and n in Formula H-I.

Examples of the compound represented by Formula H-I used in the present invention are shown below. In the present invention, examples are by no means limited to these.

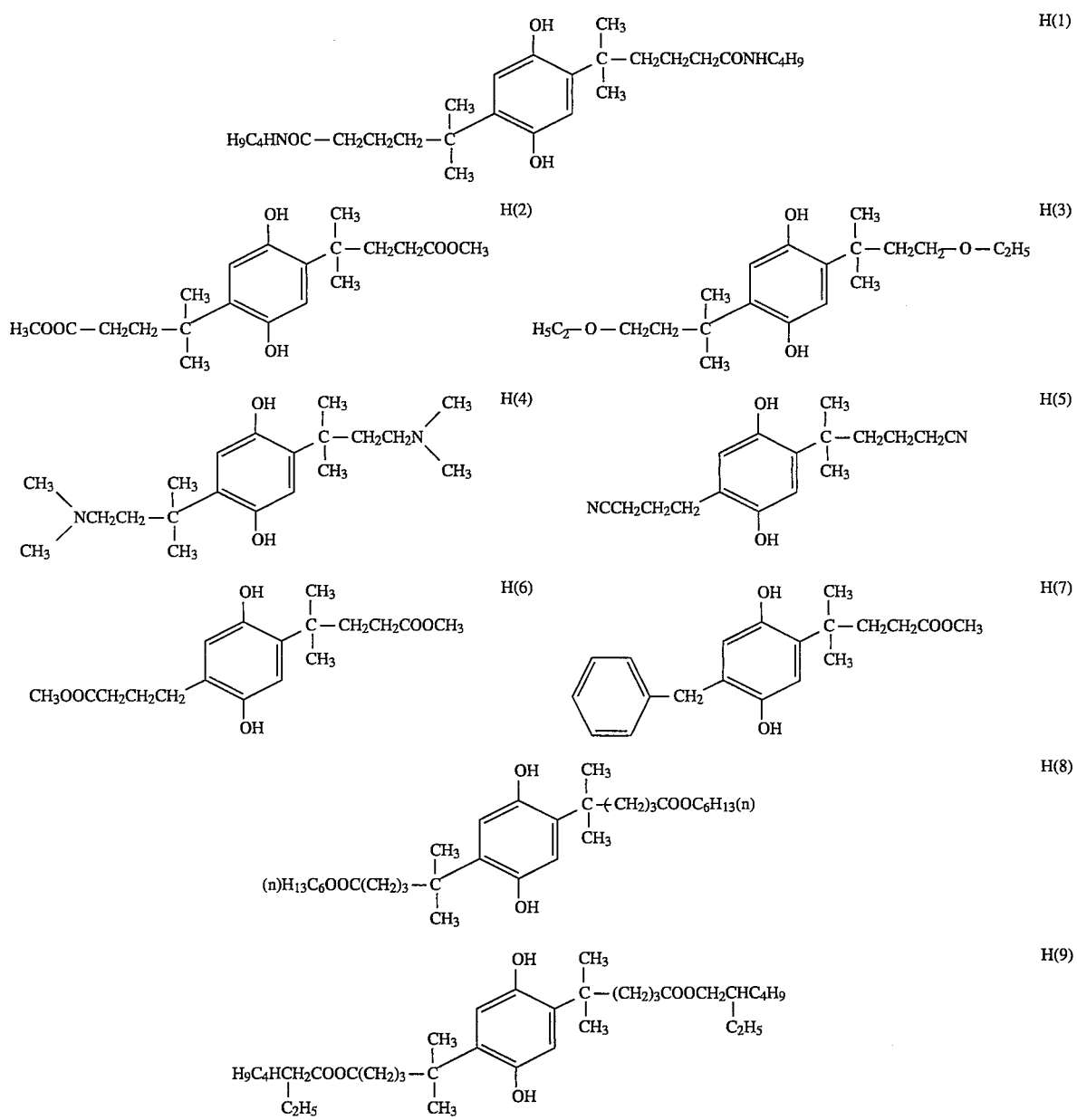

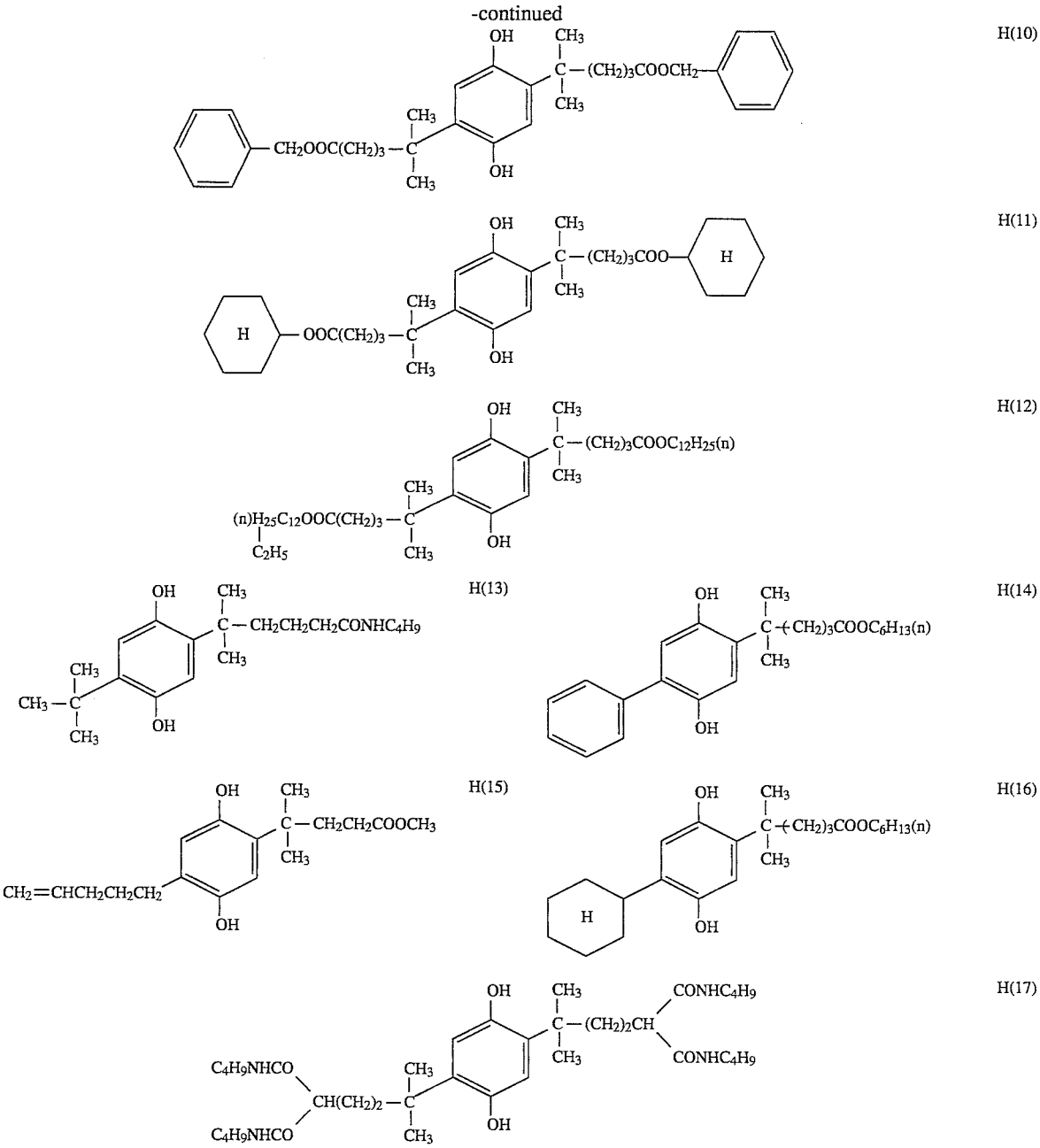

The compound represented by Formula H-I (hereinafter referred to as the compound represented by Formula H-I according to the present invention) basically includes the compounds as disclosed in Japanese Patent O.P.I. Publication No. 24141/1983, and the synthesis method also disclosed therein is available as a reference.

The compound represented by Formula H-I according to the present invention may be incorporated into at least one layer selected from non-sensitive layers as exemplified by an intermediate layer, a protective layer layer, a subbing layer and a filter layer of the light-sensitive silver halide photographic material. There are no particular limitations on the amount of the compound added. It may preferably be $1\times10^{-6}$ to $1\times10^{-2}$ mol/m$^2$. The compound represented by Formula H-I according to the present invention may be used alone or may be used in combination of two or more kinds.

The support usable in the present invention may include those disclosed in RD17643, page 28 and RD18716, page 647, previously set out. Suitable supports are those comprising polymer film, paper or the like, and these may have been subjected to treatment for improving adhesion, antistatic properties and so forth.

EXAMPLES

The present invention will be described below in greater detail. The present invention is by no means limited to these.

Example 1

A paper stuff was prepared by mixing 20% of needle-leaved tree bleached sulfite process pulp (NBSP) having been beated to a Canadian Standard freeness (JIS P-8121-76) of 250 ml by means of a refiner and 80% of broad-leaved tree bleached sulfate process pulp (LBKP) having been beated to a like freeness of 280 ml.

Paper additives were used in amounts of the following composition, based on the born dry weight of the pulp.

| | |
|---|---|
| Cationized starch | 2.0% |
| Alkylketene dimer resin | 0.4% |
| Anionic polyacrylamide resin | 0.1% |
| Polyamide-polyamine-epichlorohydrin resin | 0.7% |
| Sodium hydroxide for adjustment to pH | 7.5 |

The paper stuff containing the above additives was set on a Fourdrinier machine to carry out papermaking, followed by size pressing and machine calendering to produce a base paper with a U.S. basis weight of 170 g/m², a bulk density of 1.0 and a water content of 8% A 5% size solution prepared by dissolving carboxyl-modified PVA and sodium chloride in a ratio of 2:1 in water was used as a size press treatment agent, which was coated on both sides of the base paper in a coating weight of 2.2 g/m² each.

Both sides of the base paper thus obtained were subjected to corona discharging. On the top surface thereof, a resin coat layer comprised of a high-density polyethylene (specific gravity: 0.94; MI: 6.8) containing anatase type titanium dioxide in a concentration as shown in Table 1 was formed by extrusion coating in a thickness as shown below. On the back surface thereof, a polyethylene resin coat layer with an upper and lower double layer structure was formed by co-extrusion coating. The resulting multilayered materials were each pressed at a linear pressure of 20 kg/cm against a cleaning roll having a 20° C. matte surface to produce extruded photographic paper supports A to C.

TABLE 1

| Support | TiO$_2$ concentration (%) | Surface layer polyethylene layer thickness (µm) |
|---|---|---|
| A | 10 | 27 |
| B | 15 | 27 |
| C | 19 | 27 |

On the supports A to C thus produced, layers constituted as shown below were provided by coating on the side of the polyethylene layer containing titanium dioxide, to produce a multilayer light-sensitive silver halide color photographic material.

Preparation of emulsion EM-1:

While controlling to 40° C. an aqueous solution containing ossein gelatin, an aqueous solution containing ammonia and silver nitrate and an aqueous solution containing potassium bromide and sodium chloride (KBr:NaCl= 95:5 in molar ratio) were simultaneously added by controlled double jet precipitation to give a cubic silver chloride core emulsion with a particle diameter of 0.30 µm. At this time, pH and pAg were controlled so that grains having the form of cubes were obtained. To the resulting core emulsion, an aqueous solution containing ammonia and silver nitrate and an aqueous solution containing potassium bromide and sodium chloride (KBr:NaCl=40:60 in molar ratio) were further simultaneously added by controlled double jet precipitation to form shells until grains had an average grain size of 0.42 µm. At this time, pH and pAg were controlled so that grains having the form of cubes were obtained.

Washing with water was carried out to remove water-soluble salt, followed by addition of gelatin to give emulsion EM-1. This emulsion EM-1 had a breadth of distribution of 8%.

Preparation of emulsion EM-2:

While controlling to 40° C. an aqueous solution containing ossein gelatin, an aqueous solution containing ammonia and silver nitrate and an aqueous solution containing potassium bromide and sodium chloride (KBr:NaCl= 95:5 in molar ratio) were simultaneously added by controlled double jet precipitation to give a cubic silver chloride core emulsion with a particle diameter of 0.18 µm. At this time, pH and pAg were controlled so that grains having the form of cubes were obtained. To the resulting core emulsion, an aqueous solution containing ammonia and silver nitrate and an aqueous solution containing potassium bromide and sodium chloride (KBr:NaCl=40:60 in molar ratio) were further simultaneously added by controlled double jet precipitation to form shells until grains had an average grain size of 0.25 µm. At this time, pH and pAg were controlled so that grains having the form of cubes were obtained.

Washing with water was carried out to remove water-soluble salt, followed by addition of gelatin to give emulsion EM-2. This emulsion EM-2 had a breadth of distribution of 8%

Preparation of blue-sensitive emulsion EM-B:

Spectral sensitizer D-1 was added to EM-1 to effect spectral sensitization, followed by addition of T-1 in an amount of 600 mg per mol of silver. Thus, blue-sensitive emulsion EM-B was prepared.

Preparation of green-sensitive emulsion EM-G:

Green-sensitive emulsion EM-G was prepared in the same manner as the blue-sensitive emulsion except that spectral sensitizer D-2 was added to EM-2 to effect spectral sensitization.

Preparation of red-sensitive emulsion EM-R:

Red-sensitive emulsion EM-R was prepared in the same manner as the blue-sensitive emulsion except that spectral sensitizers D-3 and D-4 were added to EM-2 to effect spectral sensitization.

Preparation of panchromatic emulsion EM-P:

Panchromatic emulsion EM-P was prepared in the same manner as the blue-sensitive emulsion except that spectral sensitizers D-1, D-2, D-3 and D-4 were added to EM-1 to effect spectral sensitization.

Preparation of infrared-sensitive emulsion EM-I:

Infrared-sensitive emulsion EM-I was prepared in the same manner as the blue-sensitive emulsion except that spectral sensitizer D-5 was added to EM-1 to effect spectral sensitization.

T-1: 4-Hydroxy-6-methyl-1,3,3a,7-tetrazaindene

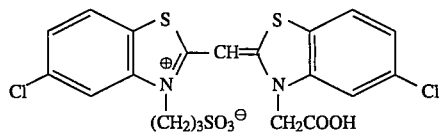

D-1

-continued

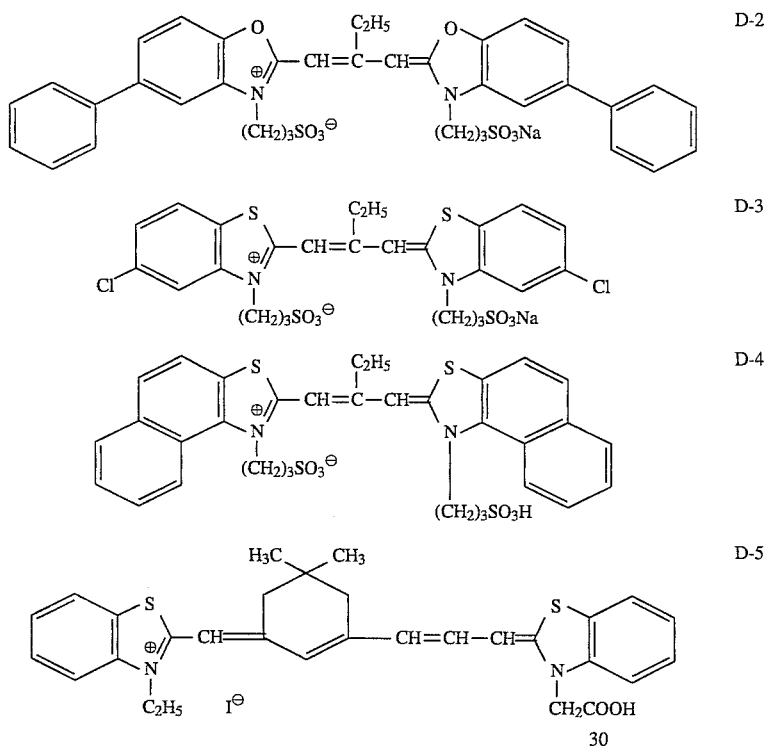

Using the above EM-B, EM-G and EM-R, light-sensitive color photographic materials with the following configuration were prepared. On the top surface of the supports A to C each, a first layer to a tenth layer were provided, and on the back surface thereof an eleventh layer, to have the following constitution. SA-1 and SA-2 were used as coating aids and H-1 and H-2 were used as hardening agents, to produce samples 1A to 1C. In the preparation of coating solutions, the panchromatic emulsion contained in the third layer, the fifth layer and the ninth layer was mixed in a coating solution prepared separately without addition of any panchromatic emulsion, and immediately thereafter coated. The gelatin used was a gelatin improved in transmittance by adding hydrogen peroxide water at the second half stage of the liming of ossein to decrease the coloring of ossein, followed by extraction.

| | |
|---|---|
| SA-1: | Sodium di(2-ethylhexyl) sulfosuccinate |
| SA-2: | Sodium di(2,2,3,3,4,4,5,5-octafluoropentyl) sulfosuccinate |
| H-1: | Sodium 2,4-dichloro-6-hydroxy-s-triazine |
| H-2: | Tetrakis(vinylsulfonylmethyl)methane |

| Layer | Constitution | Coating weight (g/m$^2$) |
|---|---|---|
| Tenth layer (Ultraviolet absorbing layer) | Gelatin | 0.78 |
| | Ultraviolet absorbent UV-1 | 0.065 |
| | Ultraviolet absorbent UV-2 | 0.120 |
| | Ultraviolet absorbent UV-3 | 0.160 |
| | Oil-soluble dye 1 | 0.5 ×10$^{-3}$ |
| | Oil-soluble dye 2 | 0.5 ×10$^{-3}$ |
| | Solvent SO-2 | 0.1 |
| | Silica matting agent | 0.03 |
| Ninth layer | Gelatin | 1.43 |

| Layer | Constitution | Coating weight |
|---|---|---|
| (Blue-sensitive layer) | Blue-sensitive emulsion EM-B (silver coating weight) | 0.4 |
| | Panchromatic emulsion EM-P (silver coating weight) | 0.1 |
| | Yellow coupler YC-1 | 0.82 |
| | Anti-stain agent AS-2 | 0.025 |
| | Solvent SO-1 | 0.82 |
| | Restrainers ST-1, ST-2, T-1 | |
| Eighth layer (Intermediate layer) | Gelatin | 0.54 |
| | Anti-color-mixture agents AS-1, AS-3, AS-4 (equimolar amounts) | 0.055 |
| | Solvent SO-2 | 0.072 |
| | Anti-irradiation agent AI-3 | 0.03 |
| Seventh layer (Yellow colloidal silver layer) | Gelatin | 0.42 |
| | Yellow colloidal silver | 0.03 |
| | Anti-color-mixture agents AS-1, AS-3, AS-4 (equimolar amounts) | 0.04 |
| | Solvent SO-2 | 0.049 |
| | Polyvinyl pyrrolidone PVP | 0.047 |
| Sixth layer (Intermediate layer) | Gelatin | 0.54 |
| | Anti-color-mixture agents AS-1, AS-3, AS-4 (equimolar amounts) | 0.055 |
| | Solvent SO-2 | 0.072 |
| Fifth layer (Green-sensitive layer) | Gelatin | 1.43 |
| | Green-sensitive emulsion EM-G (silver coating weight) | 0.40 |
| | Panchromatic emulsion EM-P (silver coating weight) | 0.10 |
| | Magenta coupler MC-1 | 0.25 |
| | Yellow coupler YC-2 | 0.06 |
| | Anti-stain agent AS-2 | 0.019 |

| Layer | Constitution | Coating weight (g/m²) |
|---|---|---|
| | Solvent SO-1 | 0.31 |
| | Restrainers ST-1, ST-2, T-1 | |
| Fourth layer (Intermediate layer) | Gelatin | 0.75 |
| | Anti-color-mixture agents AS-1, AS-3, AS-4 (equimolar amounts) | 0.055 |
| | Solvent SO-2 | 0.072 |
| | Anti-irradiation agent AI-1 | 0.03 |
| | Anti-irradiation agent AI-2 | 0.03 |
| Third layer (Red-sensitive layer) | Gelatin | 1.38 |
| | Red-sensitive emulsion EM-R (silver coating weight) | 0.24 |
| | Panchromatic emulsion EM-P (silver coating weight) | 0.06 |
| | Cyan coupler CC-1 | 0.44 |
| | Solvent SO-1 | 0.31 |
| | Anti-stain agent AS-2 | 0.015 |
| | Restrainers ST-1, ST-2, T-1 | |
| Second layer (Intermediate layer) | Gelatin | 0.54 |
| | Anti-color-mixture agents AS-1, AS-3, AS-4 (equimolar amounts) | 0.055 |
| | Solvent SO-2 | 0.072 |
| First layer (HC layer) | Gelatin | 0.54 |
| | Black colloidal silver | 0.08 |
| | Polyvinyl pyrrolidone PVP | 0.03 |
| Eleventh layer (Back surface layer) | Gelatin | 6.00 |
| | Silica matting agent | 0.65 |

Silver coating weight is in terms of silver.
In the same manner as the above sample 1, layers were formed on the supports A to C each by the use of the above EM-B, EM-G, EM-R and EM-I, to produce light-sensitive color photographic material samples 2A to 2C with the following configuration.

| Layer | Constitution | Coating weight (g/m²) |
|---|---|---|
| Twelfth layer (Ultraviolet absorbing layer) | Gelatin | 0.78 |
| | Ultraviolet absorbent UV-1 | 0.065 |
| | Ultraviolet absorbent UV-2 | 0.120 |
| | Ultraviolet absorbent UV-3 | 0.160 |
| | Solvent SO-2 | 0.1 |
| | Silica matting agent | 0.03 |
| Eleventh layer (Blue-sensitive layer) | Gelatin | 1.14 |
| | Blue-sensitive emulsion EM-B (silver coating weight) | 0.4 |
| | Yellow coupler YC-1 | 0.656 |
| | Anti-stain agent AS-2 | 0.02 |
| | Solvent SO-1 | 0.656 |
| | Restrainers ST-1, ST-2, T-1 | |
| Tenth layer (Intermediate layer) | Gelatin | 0.54 |
| | Anti-color-mixture agents AS-1, AS-3, AS-4 (equimolar amounts) | 0.055 |
| | Solvent SO-2 | 0.072 |
| | Anti-irradiation agent AI-3 | 0.03 |
| Ninth layer (Yellow colloidal silver layer) | Gelatin | 0.42 |
| | Yellow colloidal silver | 0.1 |
| | Anti-color-mixture agents AS-1, AS-3, AS-4 (equimolar amounts) | 0.05 |
| | Solvent SO-2 | 0.049 |
| | Polyvinyl pyrrolidone PVP | 0.047 |
| Eighth layer (Intermediate layer) | Gelatin | 0.54 |
| | Anti-color-mixture agents AS-1, AS-3, AS-4 (equimolar amounts) | 0.055 |
| | Solvent SO-2 | 0.072 |
| Seventh layer (Green-sensitive layer) | Gelatin | 1.14 |
| | Green-sensitive emulsion EM-G (silver coating weight) | 0.40 |
| | Magenta coupler MC-1 | 0.20 |
| | Yellow coupler YC-2 | 0.05 |
| | Anti-stain agent AS-2 | 0.0152 |
| | Solvent SO-1 | 0.248 |
| | Restrainers ST-1, ST-2, T-1 | |
| Sixth layer (Intermediate layer) | Gelatin | 0.75 |
| | Anti-color-mixture agents AS-1, AS-3, AS-4 (equimolar amounts) | 0.055 |
| | Solvent SO-2 | 0.072 |
| | Anti-irradiation agent AI-I | 0.03 |
| | Anti-irradiation agent AI-2 | 0.03 |
| Fifth layer (Red-sensitive layer) | Gelatin | 1.10 |
| | Red-sensitive emulsion EM-R (silver coating weight) | 0.24 |
| | Cyan coupler CC-2 | 0.352 |
| | Solvent SO-1 | 0.248 |
| | Anti-stain agent AS-2 | 0.012 |
| | Restrainers ST-1, ST-2, T-1 | |
| Fourth layer (Intermediate layer) | Gelatin | 0.75 |
| | Anti-color-mixture agents AS-1, AS-3, AS-4 (equimolar amounts) | 0.055 |
| | Solvent SO-2 | 0.072 |
| Third layer (Infrared-sensitive layer) | Gelatin | 1.05 |
| | Infrared-sensitive emulsion EM-I (silver coating weight) | 0.30 |
| | Yellow coupler YC-1 | 0.21 |
| | Magenta coupler MC-1 | 0.063 |
| | Cyan coupler CC-1 | 0.110 |
| | Anti-stain agent AS-2 | 0.019 |
| | Solvent SO-1 | 0.615 |
| Second layer (Intermediate layer) | Gelatin | 0.54 |
| | Anti-color-mixture agents AS-1, AS-3, AS-4 (equimolar amounts) | 0.055 |
| | Solvent SO-2 | 0.072 |
| First layer (HC layer) | Gelatin | 0.54 |
| | Black colloidal silver | 0.08 |
| | Polyvinyl pyrrolidone PVP | 0.03 |
| Thirteenth layer (Back surface layer) | Gelatin | 6.00 |
| | Silica matting agent | 0.65 |

SO-1: Trioctyl phosphate
SO-2: Dioctylphthalate
AS-1: 2,4-Di-t-octylhydroquinone
AS-2: 2,4-Di-t-butylhydroquinone
ST-1: 1-(3-Acetamidophenyl)-5-mercaptotetrazole
ST-2: N-benzyladenine

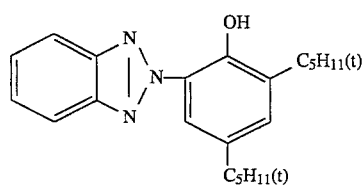 UV-1
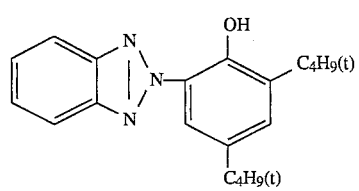 UV-2
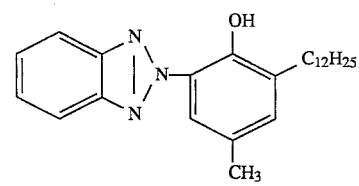 UV-3
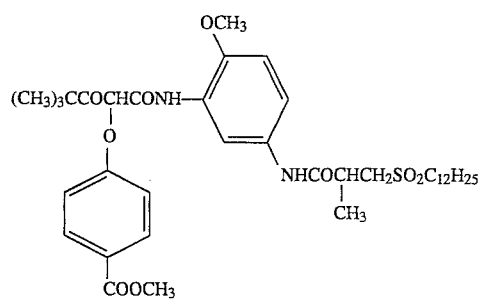 YC-1
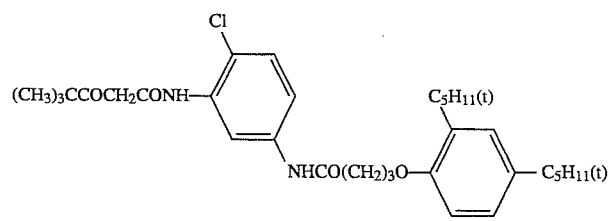 YC-2
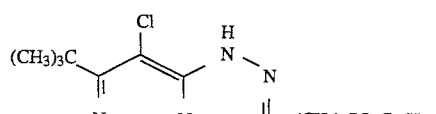 MC-1
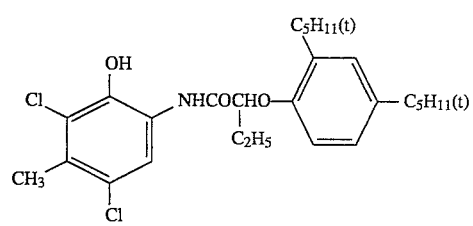 CC-1
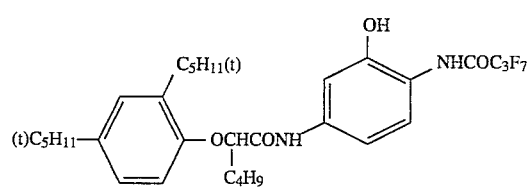 CC-2
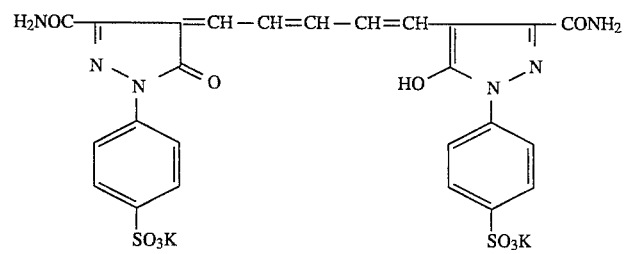 AI-1
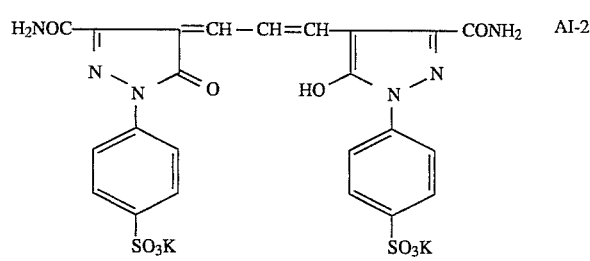 AI-2
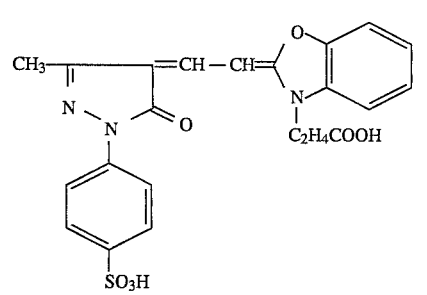 AI-3

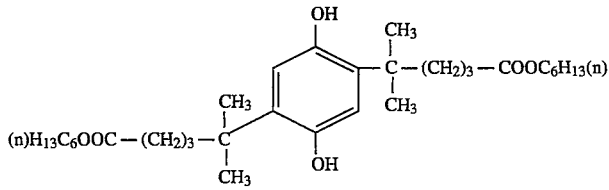

AS-3

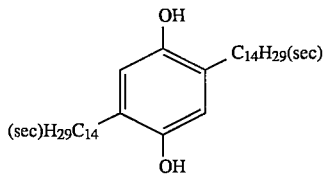 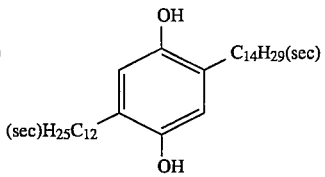 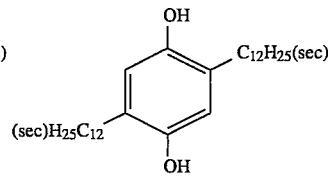

AS-4

Oil-soluble dye 1

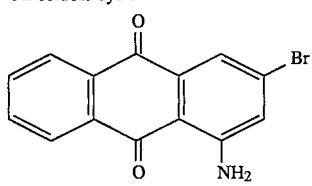

Oil-soluble dye 2

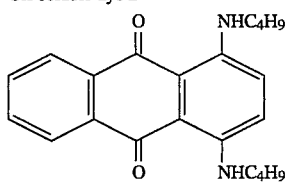

Comparative M-coupler

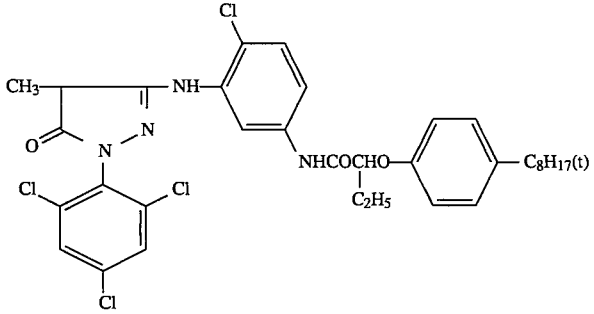

The samples 1A to 1C thus obtained were each brought into close contact with a black plate and a cyan plate among halftone dot originals, and then exposed under exposure condition 1 shown below. Subsequently, the samples were each brought into close contact with a black plate and a magenta plate, and then exposed under exposure condition 2 shown below. The samples were each further brought into close contact with a black plate and a yellow plate, and then exposed under exposure condition 3 shown below.

Next, the samples 2A to 3C were each successively exposed under conditions 1 to 3 in the same manner as the samples 1A to 1C, and further brought into close contact with only a black plate of the originals, followed by exposure under exposure condition 4 shown below.

Each light-sensitive material thus having been exposed was processed according to the photographic processing steps shown below, to obtain a dye image comprised of halftone dots.

Density measurement was made and results obtained are shown in the table. The density measurement was made using PDA-65, manufactured by konica Corporation.

Exposure condition 1:

Each light-sensitive material is exposed to white light through a red filter (Wratten No. 26) and an ND filter, where ND filter density is adjusted and exposure is carried out for 0.5 second in a smallest amount of exposure that gives a minimum red-light density after photographic processing.

Exposure condition 2:

Each light-sensitive material is exposed to white light through a green filter (Wratten No. 58) ad an ND filter, where ND filter density is adjusted and exposure is carried out for 0.5 second in a smallest amount of exposure that gives a minimum green-light density after photographic processing.

Exposure condition 3:

Each light-sensitive material is exposed to white light through a blue filter (Wratten No. 47B) and an ND filter, where ND filter density is adjusted and exposure is carried out for 0.5 second in a smallest amount of exposure that gives a minimum blue-light density after photographic processing.

Exposure condition 4:

Each light-sensitive material is successively exposed under the above exposure conditions 1 to 3. The sample thus exposed is then exposed to tungsten light through an infrared filter and an ND filter, where ND filter density is adjusted and exposure is carried out for 0.5 second in a smallest amount of exposure that gives a minimum visible-light density after photographic processing. Only the exposure carried out through the infrared filter is regarded as exposure condition 4.

A daylight fluorescent lamp was used as a light source used in the exposure carried out under exposure conditions 1 to 3.

The processing was carried out according o the following processing steps (fresh-solution processing). Here, fogging exposure was carried out while immersed in the developing solution, and the light-sensitive material was uniformly overall-exposed on its surface through a developing solution layer of 3 mm in thickness.

Other part of the samples was exposed in entirely the same manner, and processed in the same manner as in processing steps 1 except that the processing solutions in the processing steps 1 were replaced with a developing solution, a bleach-fixing solution and a stabilizing solution which were obtained after running processing had been carried out using the sample 1B until the amount of a developer replenishing solution reached 3 times the capacity of a developer tank (running-solution processing).

How the density at an image area in the images obtained by the fresh-solution processing, having a halftone dot percentage that gave a density of 0.3 when measured using green light, changed to a density at the same area in the images obtained by the running-solution processing was indicated as a difference in green density $\Delta D_G$. Blue-light density, green-light density and red-light density were also measured on the image of a solid black area of the black plate, and how their percentages $(D_B/D_G) \times 100$ and $(D_R/D_G) \times 100$ changed from the fresh-solution processing to the running-solution processing was indicated as values of $\Delta\{(D_B/D_G) \times 100\}$ and $\Delta\{(D_R/D_G) \times 100\}$, respectively.

| Processing steps 1 | Temperature | Time |
| --- | --- | --- |
| Immersion (developing solution) | 37° C. | 12 seconds |
| Fogging exposure | — | 12 seconds (1 lux) |
| Developing | 37° C. | 95 seconds |
| Bleach-fixing | 35° C. | 45 seconds |
| Stabilizing | 25–30° C. | 90 seconds |
| Drying | 60–85° C. | 40 seconds |

Composition of processing solutions

Color developing solution

| | |
| --- | --- |
| Benzyl alcohol | 15.0 ml |
| Cerium (III) sulfate | 0.015 g |
| Ethylene glycol | 8.0 ml |
| Potassium sulfite | 2.5 g |
| Potassium bromide | 0.6 g |
| Sodium chloride | 0.2 g |
| Potassium carbonate | 25.0 g |
| T-1 | 0.1 g |
| Hydroxylamine sulfate | 5.0 g |
| Sodium diethylenetriaminepentaacetate | 2.0 g |
| 4-Amino-N-ethyl-N-(β-hydroxyethyl)aniline sulfate | 4.5 g |
| Fluorescent brightening agent (4,4'-diaminostilbenedisulfonic acid derivative) | 1.0 g |
| Potassium hydroxide | 2.0 g |
| Diethylene glycol | 15.0 ml |

Made up to 1 liter in total weight by adding water, and adjusted to pH 10.15.

Bleach-fixing solution

| | |
| --- | --- |
| Ferric ammonium diethylenetriaminepentaacetate | 90.0 g |
| Diethylenetriaminepentaacetic acid | 3.0 g |
| Ammonium thiosulfate (aqueous 70% solution) | 180 ml |
| Ammonium sulfite (aqueous 40% solution) | 27.5 ml |
| 3-Mercapto-1,2,4-triazole | 0.15 g |

Adjusted to pH 7.1 using potassium carbonate or glacial acetic acid, and made up to 1 liter in total weight by adding water.

Stabilizing solution

| | |
| --- | --- |
| o-Phenylphenol | 0.3 g |

-continued

| | |
| --- | --- |
| Potassium sulfite (aqueous 50% solution) | 12 ml |
| Ethylene glycol | 10 g |
| 1-Hydroxyethylidene-1,1-diphosphonic acid | 2.5 g |
| Bismuth chloride | 0.2 g |
| Zinc sulfate septahydrate | 0.7 g |
| Ammonium hydroxide (aqueous 28% solution) | 2.0 g |
| Polyvinyl pyrrolidone K-17 | 0.2 g |
| Fluorescent brightening agent (4,4'-diaminostilbenedisulfonic acid derivative) | 2.0 g |

Made up to 1 liter in total weight by adding water, and adjusted to pH 7.5 using ammonium hydroxide or sulfuric acid. The stabilizing was carried out in a countercurrent system comprised of two-tanks. Formulations of replenishing solutions used in running processing are shown below.

Color developing replenishing solution

| | |
| --- | --- |
| Benzyl alcohol | 18.5 ml |
| Cerium (III) sulfate | 0.015 g |
| Ethylene glycol | 10.0 ml |
| Potassium sulfite | 2.5 g |
| Potassium bromide | 0.3 g |
| Sodium chloride | 0.2 g |
| Potassium carbonate | 25.0 g |
| T-1 | 0.1 g |
| Hydroxylamine sulfate | 5.0 g |
| Sodium diethylenetriaminepentaacetate | 2.0 g |
| 4-Amino-N-ethyl-N-(β-hydroxyethyl)aniline sulfate | 5.4 g |
| Fluorescent brightening agent (4,4'-diaminostilbenedisulfonic acid derivative) | 1.0 g |
| Potassium hydroxide | 2.0 g |
| Diethylene glycol | 18.0 ml |

Made up to 1 liter in total weight by adding water, and adjusted to pH 10.35.

—Bleach-fixing replenishing solution—

The same as the bleach-fixing solution described above.

—Stabilizing replenishing solution—

The same as the stabilizing solution described above.

The developing replenishing solution, the bleach-fixing replenishing solution and the stabilizing replenishing solution were each supplied in an amount of 320 ml per 1 m² of the light-sensitive material.

| Sample | Running variations at $D_G = 0.3$ image area $\Delta D_G$ | Running variations in density balance at solid black area | |
| --- | --- | --- | --- |
| | | $\Delta\{(D_B/D_G) \times 100\}$ | $\Delta\{(D_R/D_G) \times 100\}$ |
| 1A (Y) | −0.03 | +3 | +3 |
| 1B (Y) | −0.02 | +1 | +2 |
| 1C (Y) | −0.01 | +2 | +2 |
| 2A (X) | −0.08 | −10 | −7 |
| 2B (X) | −0.08 | −12 | −8 |
| 2C (X) | −0.09 | −10 | −8 |

(X): Comparative Example
(Y): Present Invention

As is clear from the above results, the samples of the present invention are seen to show a stable image density even when processed using the processing solutions having been used in running, and also have small variations in black area density balance to give good results.

Example 2

Samples 3 to 6 were produced in the same manner as the sample 1B produced in Example 1. Here, the samples 3 to 6 were produced entirely in the same manner as the sample 1B except that the magenta coupler MC-1 in the seventh layer of the sample 1B was replaced with the one as shown in Table 2.

TABLE 2

| Sample No. | Magenta coupler |
| --- | --- |
| 3 (X) | Comparative magenta coupler |
| 4 (Y) | M-I, Exemplary Compound M-1 |
| 5 (Y) | M-I, Exemplary Compound M-10 |
| 6 (Y) | M-I, Exemplary Compound M-19 |

(X): Comparative Example
(Y): Present Invention

The samples 3 to 6 thus obtained were exposed in the same manner as the sample 1B in Example, and subjected to fresh-solution processing and running processing in the same manner as in the processing steps 1 in Example except that the developing solution, the bleach-fixing and the stabilizing solution were each replenished in an amount of 640 ml per 1 m² of the light-sensitive material. As in Example 1, the density variation $\Delta D_G$ as a result of running, at the image area having a halftone dot percentage that gave a green-light density of 0.3 was measured to show the results obtained. Color tones were were also visually compared with those of magenta images printed with ink, to make evaluation on whether the color tones resembled the same (evaluated as "A") or could not be said to resemble the same (evaluated as "C") to obtain the results shown together.

| Sample | $\Delta D_G$ | Magenta tone (Fresh solution & running processing) |
| --- | --- | --- |
| 3 (X) | +0.07 | C |
| 4 (Y) | −0.01 | A |
| 5 (Y) | −0.02 | A |
| 6 (Y) | +0.02 | A |
| 7 (X) | +0.05 | C |

(X): Comparative Example
(Y): Present Invention

As is clear from the above results, the samples of the present invention are seen to show a stable image density even when processed using the processing solutions having been used in running. Also the color tones of the magenta images are seen to resemble those of magenta images printed with ink, in both the processing with fresh solutions and the processing with running solutions.

Example 3

The samples 1B, 1C, 4, 5 and 6 produced in Examples 1 and 2 were mixed together, and set on KONSENSUS, trade name, manufactured by Konica Corporation, followed by exposure and then photographic processing, where the processing was carried out for 3 months in a throughput of a processing area of 100 m² per month. As a result, good images were obtained.

As described above, use of the light-sensitive silver halide color photographic material of the present invention has made it possible to produce a color proof having a very good resemblance in image quality to a print, from halftone dot image information obtained by color separation and halftone dot image conversion.

What is claimed is:

1. A light-sensitive silver halide color photographic material comprising a support and provided thereon a yellow image forming silver halide emulsion layer, a magenta image forming silver halide emulsion layer and a cyan image forming silver halide emulsion layer, wherein said yellow image forming layer contains a Y-emulsion defined as silver halide emulsion which forms a yellow image, said magenta image forming layer contains an M-emulsion defined as a silver halide emulsion which forms a magenta image and said cyan image forming layer contains a C-emulsion which is defined as a silver halide emulsion which forms a cyan image, said Y-, M-, and C-emulsion having spectral sensitivity wavelength regions respectively different from one another; and a P-emulsion defined as a silver halide emulsion with a spectral sensitivity having a part common to the respective spectral sensitivity regions of said C-, M- and Y-emulsions contained in at least one of said image forming silver halide emulsion layers; said magenta image forming silver halide emulsion layer containing a compound represented by the following Formula M-1 and a yellow dye forming coupler

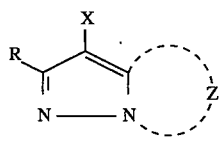

Formula M-1 where Z represents a group of non-metal atoms necessary to complete a nitrogen-containing heterocyclic ring, X represents a hydrogen atom or a group capable of being split off upon reaction with an oxidized product of a color developing agent and R represents a hydrogen atom or a substituent, and wherein a ratio of the sensitivity of said C-, M- or Y-emulsion to that of said P-emulsion is within a range of 1/10 to 10.

2. The color photographic material of claim 1, wherein said support is a reflective support comprising a base paper provided on each side thereof with a polyolefin resin coat layer, and said polyolefin resin coat layer formed on the reflective support on its side on which said silver halide emulsion layers are coated contains 13% or more, by weight, of a white pigment.

3. The color photographic material of claim 1, wherein said image forming silver halide emulsion layers each contain a previously-unfogged internal latent image silver halide emulsion.

4. The color photographic material of claim 1, wherein said yellow coupler contained in said magenta image forming layer is represented by the following Formula Y-Ia

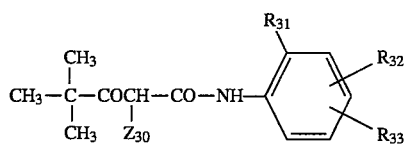

where $R_{31}$ represents a halogen atom or an alkoxyl group, $R_{32}$ represents a hydrogen atom, a halogen atom or an alkoxy group, $R_{33}$ represents an acylamino group, an alkoxycarbonyl group, an alkylsulfamoyl group, an arylsulfamoyl group, an arylsulfonamido group, an alkylureido group, an arylureido group, a succinimido group, an alkoxy group or an aryloxy group, and $Z_{30}$ represents a hydrogen atom, a monovalent organic group capable of being split off upon coupling with an oxidized product of a color developing agent, or a halogen atom.

5. A process for preparing a color proof by subjecting a light-sensitive silver halide color photographic material comprising a support and provided thereon a yellow image forming layer, a magenta image forming layer and a cyan image forming layer, to exposure based on halftone dot image information comprised of color-separated yellow, magenta and cyan image information, and black image information, wherein said light-sensitive silver halide color photographic material is the color photographic material as claimed in claim 1.

6. A light-sensitive silver halide color photographic material comprising a support and provided thereon a yellow image forming silver halide emulsion layer, a magenta image forming silver halide emulsion layer and a cyan image forming silver halide emulsion layer, wherein said yellow image forming layer contains a Y-emulsion defined as silver halide emulsion which forms a yellow image, said magenta image forming layer contains an M-emulsion defined as a silver halide emulsion which forms a magenta image and said cyan image forming layer contains a C-emulsion which is defined as a silver halide emulsion which forms a cyan image, said Y-, M-, and C-emulsions having spectral sensitivity wavelength regions respectively different from one another; and a P-emulsion defined as a silver halide emulsion with a spectral sensitivity having a part common to the respective spectral sensitivity regions of said C-, M- and Y-emulsions contained in at least one of said image forming silver halide emulsion layers; said magenta image forming silver halide emulsion layer containing a compound represented by the following Formula M-1 and a yellow dye forming coupler

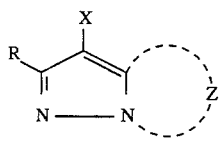

Formula M-1 where Z represents a group of non-metal atoms necessary to complete a nitrogen-containing heterocyclic ring, X represents a hydrogen atom or a group capable of being split off upon reaction with an oxidized product of a color developing agent and R represents a hydrogen atom or a substituent and wherein said yellow image forming layer contains a blue-sensitive silver halide emulsion, said magenta image forming layer contains a green-sensitive silver halide emulsion and said cyan image forming layer contains a red-sensitive silver halide emulsion; said silver halide emulsion with a sensitivity having a part common to the respective spectral sensitivity regions pertaining to said yellow, magenta and cyan image forming layers is contained in each of said yellow, magenta and cyan image forming layers and, wherein a ratio of the sensitivity of said C-, M- or y-emulsion to that of said P-emulsion is within a range of 1/10 to 10.

7. The color photographic material of claim 6, wherein said yellow coupler contained in said magenta image forming layer is represented by the following Formula Y-Ia

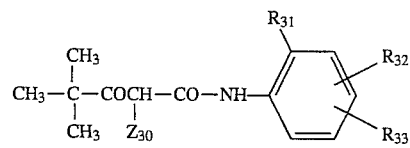

where $R_{31}$ represents a halogen atom or an alkoxyl group, $R_{32}$ represents a hydrogen atom, a halogen atom or an alkoxy group, $R_{33}$ represents an acylamino group, an alkoxycarbonyl group, an alkylsulfamoyl group, an arylsulfamoyl group, an arylsulfonamido group, an alkylureido group, an arylureido group, a succinimido group, an alkoxy group or an aryloxy group, and $Z_{30}$ represents a hydrogen atom, a monovalent organic group capable of being split off upon coupling with an oxidized product of a color developing agent, or a halogen atom.

8. The color photographic material of claim 7, wherein said image forming silver halide emulsion layers each contain a previously-unfogged internal latent image silver halide emulsion.

9. The color photographic material of claim 8, wherein said support is a reflective support comprising a base paper provided on each side thereof with a polyolefin resin coat layer, and said polyolefin resin coat layer formed on the reflective support on its side on which said silver halide emulsion layers are coated contains 13% or more, by weight, of a white pigment.

10. The color photographic material of claim 9, wherein said image forming silver halide emulsion layers each contain a previously-unfogged internal latent image silver halide emulsion.

11. The color photographic material of claim 6, wherein said support is a reflective support comprising a base paper provided on each side thereof with a polyolefin resin coat layer, and said polyolefin resin coat layer formed on the reflective support on its side on which said silver halide emulsion layers are coated contains 13% or more, by weight, of a white pigment.

12. The color photographic material of claim 11, wherein said image forming silver halide emulsion layers each contain a previously-unfogged internal latent image silver halide emulsion.

13. The color photographic material of claim 6, wherein said support is a reflective support comprising a base paper provided on each side thereof with a polyolefin resin coat layer, and said polyolefin resin coat layer formed on the reflective support on its side on which said silver halide emulsion layers are coated contains 13% or more, by weight, of a white pigment.

14. The color photographic material of claim 6, wherein said image forming silver halide emulsion layers each contain a previously-unfogged internal latent image silver halide emulsion.

* * * * *